(12) United States Patent
Lin

(10) Patent No.: US 11,664,270 B2
(45) Date of Patent: May 30, 2023

(54) METAL-INSULATOR-METAL (MIM) STRUCTURE SUPPORTING HIGH VOLTAGE APPLICATIONS AND LOW VOLTAGE APPLICATIONS

(71) Applicant: Intel Corporation, Santa Clara, CA (US)

(72) Inventor: Kevin Lin, Beaverton, OR (US)

(73) Assignee: Intel Corporation, Santa Clara, CA (US)

(*) Notice: Subject to any disclaimer, the term of this patent is extended or adjusted under 35 U.S.C. 154(b) by 161 days.

(21) Appl. No.: 17/222,790

(22) Filed: Apr. 5, 2021

(65) Prior Publication Data

US 2021/0225696 A1 Jul. 22, 2021

Related U.S. Application Data

(63) Continuation of application No. 16/649,081, filed as application No. PCT/US2017/068551 on Dec. 27, 2017, now Pat. No. 10,971,393.

(51) Int. Cl.
*H01L 21/768* (2006.01)
*H01L 23/522* (2006.01)

(52) U.S. Cl.
CPC .. *H01L 21/76805* (2013.01); *H01L 21/76831* (2013.01); *H01L 23/5223* (2013.01)

(58) Field of Classification Search
CPC ......... H01L 21/76805; H01L 21/76831; H01L 23/5223; H01L 23/5226; H01L 21/76816
See application file for complete search history.

(56) References Cited

U.S. PATENT DOCUMENTS

| | | |
|---|---|---|
| 5,285,017 A | 2/1994 | Gardner |
| 5,439,731 A | 8/1995 | Li et al. |
| 5,935,868 A | 8/1999 | Fang et al. |
| 5,950,107 A | 9/1999 | Huff et al. |
| 6,191,481 B1 | 2/2001 | Bothra et al. |
| 6,245,996 B1 | 6/2001 | Atakov et al. |
| 9,391,019 B2 | 7/2016 | Kobrinsky et al. |

(Continued)

OTHER PUBLICATIONS

Extended European Search Report from European Patent Application No. 17936595.2 dated Jul. 2, 2021, 8 pgs.

(Continued)

*Primary Examiner* — John P. Dulka
(74) *Attorney, Agent, or Firm* — Essential Patents Group, LLP

(57) ABSTRACT

An apparatus is provided which includes: a first stack including a lower, a middle, and an upper layer of conductive material with insulator layers therebetween, and a second stack including the middle and upper layers with one of the insulator layers therebetween. In an example, a first of the insulator layers has a lower breakdown voltage than a second of the insulator layers. The apparatus further includes a first via over the first stack, wherein the first via is in contact with a pair of the lower, middle and upper layers that have the first of the insulator layers therebetween. The apparatus further includes a second via over the second stack, wherein the second via extends through the upper layer and is in contact with the middle layer. In an example, the second via is isolated from a sidewall of the upper layer by a spacer.

20 Claims, 10 Drawing Sheets

(56) References Cited

U.S. PATENT DOCUMENTS

| | | |
|---|---|---|
| 9,786,603 B1 | 10/2017 | Clavenger et al. |
| 10,083,863 B1 | 9/2018 | Hsieh et al. |
| 10,141,330 B1 | 11/2018 | Lindsay et al. |
| 2004/0071991 A1 | 4/2004 | Atakov et al. |
| 2006/0171098 A1 | 8/2006 | Won |
| 2007/0216030 A1 | 9/2007 | Schindler et al. |
| 2009/0020744 A1 | 1/2009 | Mizukami et al. |
| 2009/0053892 A1 | 2/2009 | Meyer et al. |
| 2009/0212350 A1 | 8/2009 | Kidoh et al. |
| 2009/0224365 A1 | 9/2009 | Remmel et al. |
| 2010/0038782 A1 | 2/2010 | Yang et al. |
| 2010/0133599 A1 | 6/2010 | Chae et al. |
| 2010/0164116 A1 | 7/2010 | Li et al. |
| 2010/0224962 A1 | 9/2010 | Kim |
| 2011/0006645 A1 | 1/2011 | Chen et al. |
| 2011/0032659 A1 | 2/2011 | Dunn et al. |
| 2011/0032660 A1 | 2/2011 | Dunn et al. |
| 2012/0058640 A1 | 3/2012 | Kim et al. |
| 2012/0156881 A1 | 6/2012 | Haffner |
| 2012/0181701 A1 | 7/2012 | Chen et al. |
| 2012/0225550 A1 | 9/2012 | Blatchford |
| 2012/0306090 A1* | 12/2012 | Smith ............... H01L 27/11556 257/773 |
| 2013/0105948 A1 | 5/2013 | Kewley |
| 2013/0234216 A1 | 9/2013 | Chou et al. |
| 2014/0027922 A1 | 1/2014 | Uzoh |
| 2014/0054535 A1 | 2/2014 | Chen et al. |
| 2014/0248773 A1 | 9/2014 | Tsai |
| 2014/0264740 A1 | 9/2014 | Stribley |
| 2015/0064916 A1 | 3/2015 | Shieh et al. |
| 2015/0108607 A1 | 4/2015 | Chen et al. |
| 2015/0221716 A1 | 8/2015 | Jakushokas et al. |
| 2015/0318263 A1 | 11/2015 | Yu et al. |
| 2016/0071799 A1 | 3/2016 | Hsieh et al. |
| 2016/0099209 A1 | 4/2016 | Nishihara |
| 2016/0204102 A1 | 7/2016 | Chen |
| 2016/0218059 A1 | 7/2016 | Nakada et al. |
| 2016/0372369 A1 | 12/2016 | Shaviv |
| 2017/0110402 A1 | 4/2017 | Smith et al. |
| 2018/0096934 A1 | 4/2018 | Siew et al. |
| 2018/0350611 A1 | 12/2018 | Kim et al. |
| 2019/0013269 A1* | 1/2019 | Zhang ............... H01L 21/76831 |
| 2019/0096759 A1 | 3/2019 | Chang et al. |
| 2019/0139887 A1 | 5/2019 | Lin et al. |
| 2019/0273021 A1 | 9/2019 | Ohashi |
| 2019/0287987 A1 | 9/2019 | Oshiki |
| 2019/0371898 A1 | 12/2019 | Huang |
| 2020/0006261 A1 | 1/2020 | Lin |
| 2020/0013900 A1 | 1/2020 | Carr et al. |
| 2020/0066521 A1 | 2/2020 | Lin et al. |
| 2020/0075618 A1 | 3/2020 | Oike |
| 2020/0152502 A1 | 5/2020 | Hsu |
| 2020/0194376 A1 | 6/2020 | Naylor et al. |
| 2020/0219804 A1 | 7/2020 | Jezewski et al. |
| 2020/0227348 A1 | 7/2020 | Lin |
| 2020/0303246 A1 | 9/2020 | Varghese et al. |
| 2021/0118851 A1 | 4/2021 | Richards et al. |

OTHER PUBLICATIONS

International Preliminary Report on Patentability from PCT/US2017/068551 dated Jul. 9, 2020, 9 pgs.
International Preliminary Report on Patentability from PCT/US2017/068561 dated Jul. 9, 2020, 12 pgs.
International Preliminary Report on Patentability from PCT/US2017/068587 dated Jul. 9, 2020, 13 pgs.
International Preliminary Report on Patentability from PCT/US2017/068590 dated Jul. 9, 2020, 11 pgs.
International Search Report and Written Opinion from PCT/US2017/068551 dated Sep. 27, 2018, 12 pgs.
International Search Report and Written Opinion from PCT/US2017/068561 dated Sep. 27, 2018, 13 pgs.
International Search Report and Written Opinion from PCT/US2017/068587 dated Sep. 18, 2018, 16 pgs.
International Search Report and Written Opinion from PCT/US2017/068590 dated Sep. 27, 2018, 14 pgs.
Notice of Allowance from U.S. Appl. No. 16/649,081 dated Dec. 14, 2020, 13 pgs.

* cited by examiner

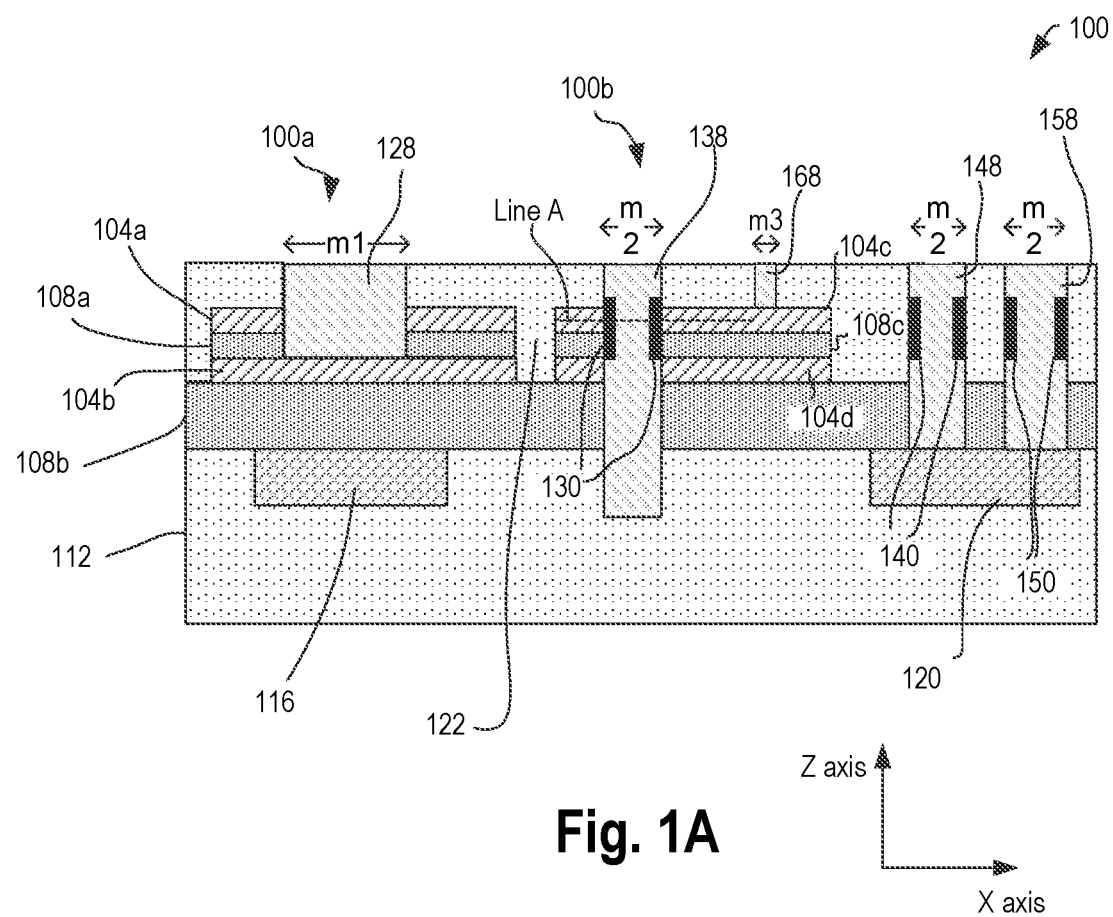
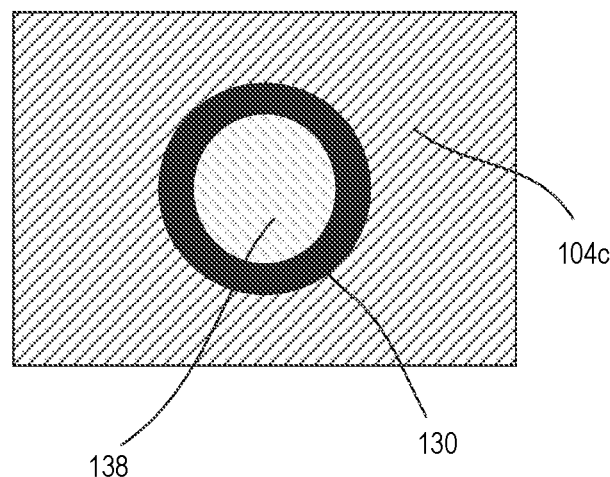
Fig. 1A
Fig. 1B

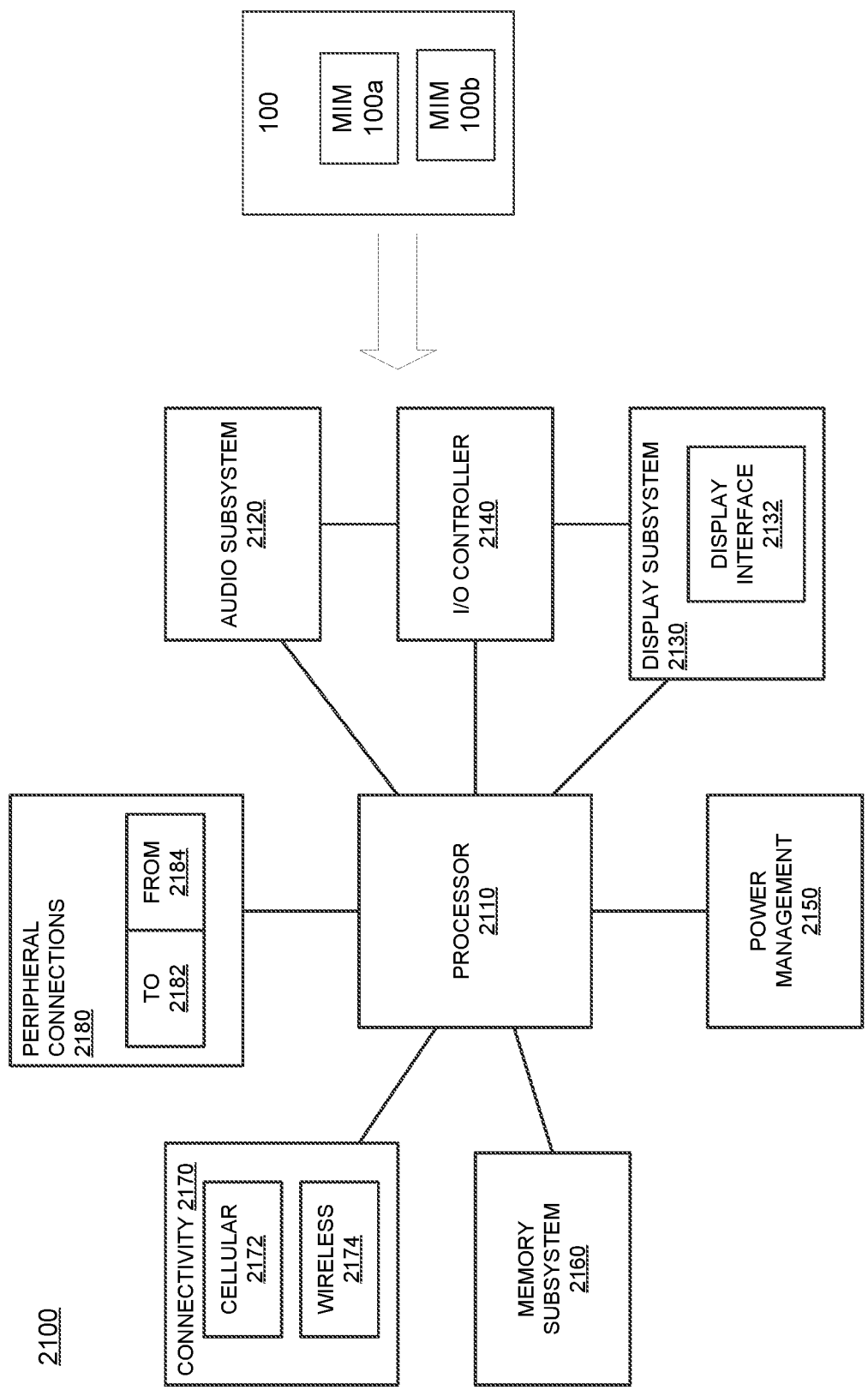

METAL-INSULATOR-METAL (MIM) STRUCTURE SUPPORTING HIGH VOLTAGE APPLICATIONS AND LOW VOLTAGE APPLICATIONS

CLAIM OF PRIORITY

This application is a Continuation of, and claims priority to, U.S. patent application Ser. No. 16/649,081, filed on Mar. 19, 2020 and titled "METAL-INSULATOR-METAL (MIM) STRUCTURE SUPPORTING HIGH VOLTAGE APPLICATIONS AND LOW VOLTAGE APPLICATIONS," which is a National Stage Entry of, and claims priority to, PCT Application No. PCT/US2017/068551, filed on Dec. 27, 2017 and titled "METAL-INSULATOR-METAL (MIM) STRUCTURE SUPPORTING HIGH VOLTAGE APPLICATIONS AND LOW VOLTAGE APPLICATIONS," which is incorporated by reference in its entirety for all purposes.

BACKGROUND

Integrated circuit chips often comprise passive components, such as capacitors, resistors, inductors, etc. Metal-Insulator-Metal (MIM) capacitor is a passive component that may be used in many applications, such as Radio Frequency (RF) applications, in analog integrated circuits, etc. MIM capacitors have attracted great attention because of their high capacitance density that supplies small area, increases circuit density, and further reduces the fabrication cost.

In many applications, it may be useful to have a MIM to be used as a capacitor in a relatively high voltage application, and an adjacent MIM to be used as a capacitor in a relatively low voltage application. In an example, in a conventional system, if both a high voltage MIM and a low voltage MIM are to be supported on a same wafer or process, this may require multiple mask layers (e.g., each mask layer to form a corresponding metal or insulator layer of a MIM), which may be costly and/or time consuming.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 1A illustrates a device comprising two adjacent MIMs, which may be configured for a high voltage operation and a low voltage operation, respectively, according to some embodiments.

FIG. 1B illustrates a plan view of a via surrounded by a spacer, according to some embodiments.

FIG. 4 illustrates a computing device or a SoC (System-on-Chip) comprising a device including a MIM with a high voltage capacitor and a MIM with a low voltage capacitor, according to some embodiments.

DETAILED DESCRIPTION

Figure 2A:
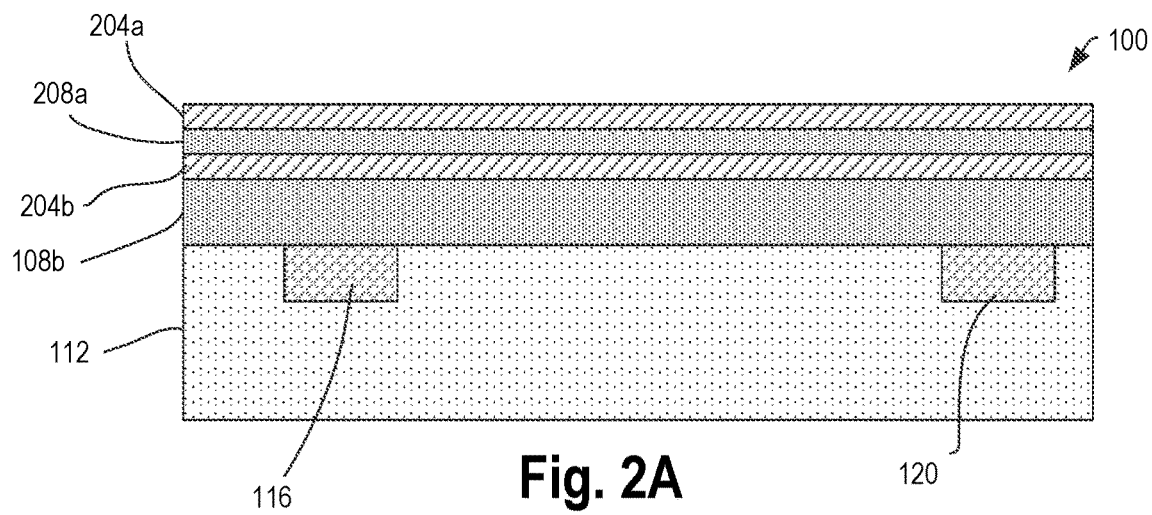
FIGS. 2A, 2B, 2C, 2D, 2E, 2F, 2G, 2H, 2I, 2J, 2K, 2L, 2M, and 2N illustrate example processes for formation of the device of FIG. 1A, according to some embodiments.

MIM capacitors are a particular type of capacitor, having a top metal plate and a bottom metal plate separated by a capacitor dielectric, which are often implemented in integrated circuits. In an example, a MIM capacitor may have multiple stacked conductive layers, each separated from an adjacent one by an insulator layer. In many applications (e.g., circuits used for RF applications), it may be useful to have a MIM to be used as a capacitor in a relatively high voltage application, and an adjacent MIM to be used as a capacitor in a relatively low voltage application.

In an example, an electric field of a capacitor may be given by:

$$E = V/d, \qquad \text{Equation 1,}$$

where E may be the electric field, V may be the applied voltage, and d may be a distance between adjacent conductive plates.

In an example, a capacitance C of a capacitor may be given by:

$$C = \varepsilon \cdot A/d, \qquad \text{Equation 2,}$$

where $\varepsilon$ may be a permittivity associated with the capacitor, A may be an area of the capacitor, and d may be the distance between adjacent conductive plates.

In an example, an insulator may support limited electrical field, thereby limiting the value of E in equation 1. For example, for higher voltage application (e.g., high V in equation 1), the distance d may have to be increased. However, an increase in the distance d may result in a corresponding decrease in the capacitance.

In some embodiments, this disclosure discloses a device having a high voltage MIM capacitor formed adjacent to a low voltage MIM capacitor. In some embodiments, a via for the high voltage MIM capacitor has a larger width than the vias for the low voltage MIM capacitor. As discussed in further details herein, the difference in the dimensions of various vias allow for formation of the adjacent capacitors (e.g., on a same wafer, and using at least in part a same formation process). In some embodiments, the low voltage capacitor has at least a via passing through a conductive plate, without being in contact with the conductive plate (e.g., a spacer may block contact of the via from the conductive plate). Such designs and other features may allow formation of conductive and insulating layers of the high voltage capacitor MIM using a single mask, as discussed in further details herein. Similarly, conductive and insulating layers of the low voltage capacitor MIM may also be formed using a single mask, as discussed in further details herein. Thus, the principles of this disclosure may be used to reduce a number of masks for forming the device comprising the high voltage MIM and adjacent low voltage MIM, thereby resulting in cost, time and/or area improvements. Other technical effects will be evident from the various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on." The terms "substantially," "close," "approximately," "near," and "about," generally refer to being within +/−10% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C). The terms "left," "right," "front," "back," "top," "bottom," "over," "under," and the like in the description and in the claims, if any, are used for descriptive purposes and not necessarily for describing permanent relative positions.

FIG. 1A illustrates a device 100 comprising two adjacent MIMs 100a and 100b, which may be configured for a high voltage operation and a low voltage operation, respectively, according to some embodiments. The MIM 100a may be configured for high voltage operation, where the high voltage may be, merely as an example, 5 Volts (V) or higher. The MIM 100b may be configured for low voltage operation, where the low voltage may be, merely as an example, less than 5 V. In some embodiments, the MIMs 100a and 100b are configured as two respective capacitors.

In some embodiments, the MIM 100a comprises conductive layers 104a and 104b, and insulating layers 108a and 108b, arranged in an interleaved stack. In some embodiments, the MIM 100b comprises conductive layers 104c and 104d, and insulating layers 108c and 108b, arranged in an interleaved stack. Thus, the insulating layer 108b may be common to both the MIMs 100a and 100b. Although FIG. 1A illustrates two conductive layers and two insulating layers in each of the MIMs 100a and 100b, in some embodiments, the principles of this disclosure can be applied to MIMs comprising higher number of stacked conductive layers 104 and insulating layers 108.

Elements referred to herein with a common reference label followed by a particular number or alphabet may be collectively referred to by the reference label alone. For example, conductive layers 104a, 104b, 104c, 104d may be collectively and generally referred to as conductive layers 104 in plural, and conductive layer 104 in singular. Similarly, insulating layers 108a, 108b, 108c may be collectively and generally referred to as insulating layers 108 in plural, and insulating layer 108 in singular.

In some embodiments and as discussed in further details herein, the conductive layers 104c and 104d are of a single continuous conductive layer (e.g., the conductive layers 104c and 104d may be formed by selectively etching the single continuous conductive layer). In an example, the conductive layers 104c and 104d may be referred to herein as part of a same layer. For example, the conductive layers 104c and 104d may be referred to herein as an upper layer of the MIMs 100a and 100b, respectively. Similarly, for example, the conductive layers 104b and 104d may be referred to herein as a middle layer of the MIMs 100a and 100b, respectively. In example, the insulating layers 108a and 108c may be formed by etching and dividing a single insulating layer. Thus, the insulating layers 108a and 108c may be referred to herein as a first insulating layer of the MIMs 100a and 100b, respectively (e.g., the insulating layers 108a and 108c may be referred to using a common label, such as a first insulating layer). In an example, the insulating layer 108b may be referred to herein as a second insulating layer of the MIMs 100a and 100b, respectively.

In some embodiments, heights of the conductive layers 104a and 104c along the Z axis in FIG. 1A are similar (e.g., as both the conductive layers 104a and 104c may be of a same conductive layer, as discussed herein), e.g., with ±10% of each other; a height of the conductive layers 104b and 104d may be similar (e.g., with ±10% of each other); and a height of the insulating layers 108a and 108c may be similar (e.g., with ±10% of each other).

In some embodiments and as illustrated in FIG. 1A, a thickness or height of the insulating layer 108b (e.g., along a Z axis) is larger than thicknesses or heights of one or more of the conductive layers 104a, 104b, 104c, 104d and/or the insulating layers 108a and 108c. For example, the height of the insulating layer 108b may be at least double or more than the heights of the conductive layers 104a, 104b, 104c, 104d and/or the insulating layers 108a and 108c. In another example, the height of the insulating layer 108b may be up to about 10 times the heights of the conductive layers 104a, 104b, 104c, 104d and/or the insulating layers 108a and 108c. For example, because the high voltage capacitor is formed using the insulating layer 108b, the height of the insulating layer 108b may be relatively larger. In contrast, because the low voltage capacitor is formed using the insulating layer 108c, the height of the insulating layer 108c may be relatively smaller. In some embodiments, the heights of the insulating layers 108b and 108c is based on the voltage ratings of the high voltage capacitor and the low voltage capacitor, respectively.

In some embodiments, the insulating layer 108b has a higher breakdown voltage than one or both of the insulating layers 108a and 108c. For example, a breakdown voltage of a layer may be based on a composition of the layer, a thickness of the layer, a dielectric strength of the layer, etc. As the thickness or height of the insulating layer 108b is larger than thicknesses or heights of the insulating layers 108a and 108c, the insulating layer 108b has a higher breakdown voltage than the insulating layers 108a and 108c.

In some embodiments, sizes of the stacked layers 104 and 108 determine a capacitance of the MIMs 100a and 100b, and the size of individual ones of the stacked layers 104 and 108 is based on a desired capacitance of the MIMs 100a and 100b. In some embodiments, the dimensions (e.g., length and width, but not necessarily the height) of the layers 104a, 108a, and 104b are similar (e.g., the dimensions of these layers may be within 5% of each other), e.g., as these layers may be formed using a single mask, as discussed in further details herein. In some embodiments, the dimensions (e.g., length and width, but not necessarily the height) of the layers 104c, 108c, and 104d are similar (e.g., the dimensions of these layers may be within 5% of each other), e.g., as these layers may be formed using a single mask, as discussed in further details herein.

In some embodiments, the conductive layers 104 include conductive material, such as, but not limited to, one or more of platinum (Pt), aluminum-copper (AlCu), titanium nitride (TiN), gold (Au), titanium (Ti), tantalum (Ta), tantalum nitride (TaN), tungsten (W), tungsten nitride (WN), copper (Cu), and/or the like. In some embodiments, the insulating layers 108 include insulating or dielectric material, such as, but not limited to, one or more of nickel oxide (NiO), titanium oxide (TiO), hafnium oxide (HfO), zirconium oxide (ZrO), zinc oxide (ZnO), tungsten oxide (WO3), aluminum oxide (Al2O3), tantalum oxide (TaO), molybdenum oxide (MoO), copper oxide (CuO), silicon dioxide (SiO2), silicon nitride (Si3 N4), polymide, and/or the like.

In some embodiments, the MIMs 100a, 100b are formed over an Inter-layer Dielectric (ILD) 112. For example, a bottom side of the MIMs 100a, 100b may be encapsutaed by the ILD 112. In some embodiments, a top side of the MIMs 100a, 100b (e.g., which may be opposite the bottom side) are encapsulated by ILD 122. Any appropriate dielectric material (e.g., low k dielectric material) may be used for the ILDs 112 and 122.

In some embodiments, the MIM 100a includes a conductive layer 116, which may form a bottom electrode of the MIM 100a (e.g., the conductive layer 116 may also be referred to as bottom electrode 116, or simply as electrode 116, of the MIM 100a). The electrode 116 may be form on the insulating layer 108b, and may be aligned to be underneath the stack comprising the layers 104a, 108a, and 104b. The electrode 116 may include conductive material, such as, but not limited to, one or more of platinum (Pt), aluminum-copper (AlCu), titanium nitride (TiN), gold (Au), titanium (Ti), tantalum (Ta), tantalum nitride (TaN), tungsten (W), tungsten nitride (WN), copper (Cu), and/or the like. Merely as an example, the electrode 116 may comprise copper.

In some embodiments, the device 100 includes an interconnect layer 120 including conductive material such as, but not limited to, one or more of platinum (Pt), aluminum-copper (AlCu), titanium nitride (TiN), gold (Au), titanium (Ti), tantalum (Ta), tantalum nitride (TaN), tungsten (W), tungsten nitride (WN), copper (Cu), and/or the like. Merely as an example, the interconnect layer 120 includes copper. In some embodiments, the interconnect layer 120 is not aligned (e.g., may not be underneath) the stack comprising the layers 104a, 108a, and 104b, or the stack comprising the layers 104c, 108c, and 104d.

In some embodiments, the MIM 100a comprises a via 128 that is at least in part through the stack comprising the layers 104a, 108a, and 104b. For example, the via 128 may extend through the conductive layer 104a and the insulating layer 108a, and may be in contact with the conductive layer 104b (e.g., may extend partially or fully through the conductive layer 104b). In an example, the via 128 may be in contact with the insulating layer 108b. In some embodiments, the via 128 is not in contact with the electrode 116 (e.g., the via may not extend through the insulating layer 108b). Thus, in an example, the via 128 may electrically connect the conductive layers 104a and 104b.

In some embodiments, the insulating layer 108b separates the conductive layer 104b from the electrode 116. In some embodiments, when voltage is applied between the via 128 and the electrode 116, a capacitance is formed between the conductive layer 104b and the electrode 116 of the MIM 100a. In an example, as the insulating layer 108b may be relatively thick (e.g., having height larger than the height of the insulating layer 108c), the capacitor developed between the conductive layer 104b and the electrode 116 of the MIM 100a may be able to handle relatively higher voltage (e.g., compared to that of the MIM 100b). It may be noted that as the conductive layers 104a and 104b are connected by the via 128, these two conductive layers may be at similar potential.

Thus, in some embodiments, upper conductive layer 104a, middle conductive layer 104b and lower conductive layer (or electrode) 116 may form a capacitor stack (e.g., along with the interleaved insulating layers 108a and 108b) associated with the MIM 100a. As discussed, this capacitor stack may be rated for relatively higher voltage (e.g., compared to that of the MIM 100b).

In some embodiments, the MIM 100b comprises a first via 138 and a second via 168. The first via 138 may extend at least in part through the stack comprising the layers 104c, 108c, 104d, 108b. For example, in the embodiment of FIG. 1A, the first via 138 extends through the layers 104c, 108c, 104d, 108b, and may be partially through the ILD 112. In another embodiment, the first via 138 extends through the layers 104c, 108c, and is in contact with, partially extend, or fully extend through the layer 104d. In another embodiment, the first via 138 extends through the layers 104c, 108c, 104d, and is in contact with, partially extend, or fully extend through the layer 108b.

In some embodiments, the via 138 is coupled to (e.g., in direct contact with, and attached to) the conductive layer 104d. In some embodiments, the via 138 is not in contact with the conductive layer 104c. For example, one or more spacers 130 may isolate (e.g., physically and/or electrically isolate) the via 138 from the conductive layer 104c. For example, the spacer 130 may be between one or more sidewalls of the conductive layer 104c and a portion of the via 138 that extends through the conductive layer 104c. For example, the spacer 130 may act as a blocking layer to block or isolate the via 138 from the conductive layer 104c. In an example, the spacer 130 may also partially or fully isolate the via 138 from the insulating layer 108c. Thus, the spacer 130 may result in the via 138 being in contact with the conductive layer 104d, while being isolated from the conductive layer 104c.

FIG. 1B illustrates a plan view of the via 138 surrounded by the spacer 130, according to some embodiments. For example, the plan view of FIG. 1B may be along the line A of FIG. 1A. As illustrated in FIG. 1B, the spacers 130 may isolate the via 138 from the conductive layer 104c. For example, the spacer 130 may be between one or more sidewalls of the conductive layer 104c and a portion of the via 138 that extends through the conductive layer 104c.

Referring again to FIG. 1A, in some embodiments, the via 168 of the MIM 100b is in contact with the conductive layer 104c, while being isolated from the conductive layer 104d. For example, the via 168 may be in direct contact with, or at least partially or fully penetrate, the conductive layer 104c.

In some embodiments, the insulating layer 108c separates the conductive layer 104c from the conductive layer 104d.

In some embodiments, when voltage is applied between the via 138 and the via 168, a capacitance is formed between the conductive layers 104c and 104d. In an example, as the insulating layer 108c may be relatively thin (e.g., having height smaller than the height of the insulating layer 108b), the capacitor developed between the conductive layers 104c and 104d of the MIM 100b may be able to handle relatively lower voltage (e.g., compared to that of the MIM 100a). In an example, the conductive layer 108b may not be used for developing the capacitance in the MIM 100b.

Thus, in some embodiments, upper conductive layer 104c and middle conductive layer 104d may form a capacitor stack (e.g., along with the interleaved insulating layers 108c and 108b) associated with the MIM 100b. As discussed, this capacitor stack may be rated for relatively lower voltage (e.g., compared to that of the MIM 100a).

Thus, in an example, the capacitor formed using the MIM 100a may be used for higher voltage applications, and the capacitor formed using the MIM 100b may be used for lower voltage applications. In an example, the high and low voltage capacitors may coexist adjacent to each other in the same chip.

In some embodiments, the spacer 130 has high breakdown voltage. For example, the breakdown voltage of the spacer 130 exceeds the breakdown voltage of the insulator layer 108c, e.g., so that the spacer 130 can withstand higher voltage than the insulating layer 108c, where the insulating layer 108c forms a part of the capacitor associated with the MIM 100b.

In some embodiments, the interconnect layer 120 is coupled to vias 148 and 158. The interconnect layer 120 may form an interconnection between the vias 148 and 158. In some embodiments, the vias 148 and 158 respectively comprise spacers 140 and 150 (e.g., as a byproduct of forming the spacers on the via 138). In an example, the spacers 148, 158 may not be used for any isolation purposes. In some other embodiments and although not illustrated in FIG. 1A, the spacers 140 and 150 are absent from the device 100. In some other embodiments and although not illustrated in FIG. 1A, the interconnect layer 120 and/or the vias 148 and 158 are absent from the device 100.

In some embodiments, the via 128 has a width (e.g., a cross-sectional diameter) of about m1; one or more of the vias 138, 148, and 158 has a width (e.g., a cross-sectional diameter) of about m2; and the via 168 has a width (e.g., a cross-sectional diameter) of about m3. In some embodiments, the dimensions m1, m2, and m3 are substantially different, e.g., m1 may be higher than m2, and m2 may be higher than m3. For example, m1 may be at least double or more than m2, and m2 may be at least double or more than m3. The difference in the dimensions m1, m2, and m3 may facilitate selective isolation of the vias 128-168, such that a sidewall of via 128 is unlined (e.g., by spacers 130-150) and continuity with both conductive layers 104a and 104b is maintained.

Although the components 128, 138, 148, 158, and 168 are referred to as vias, these components may also be referred to as metal plugs, interconnection structures, and/or the like.

Although the insulating layer 108b is illustrated to be a continuous layer among the two capacitor stacks of the two MIMs 100a and 100b, in some embodiments (and although not illustrated in FIG. 1A), the insulating layer 108b may also be separated to form two discontinuous layers for the two respective capacitor stacks.

In some embodiments and although not illustrated in FIG. 1A, the thickness of the insulating layer 108b can be swapped with the thickness of the insulating layers 108a and 108c. In such an embodiment, the insulating layer 108b is thinner than the insulating layers 108a and 108c. In such embodiments, for example, the via 128 is in contact with the conductive layer 104a, but not in contact with the conductive layer 104b (e.g., similar to the via 168 of FIG. 1A), and the electrode 116 extends through the bottom insulating layer 108b and is in contact with the conductive layer 104b. Positions and/or thicknesses of various layers and/or vias of the device 100 may be altered in some example.

Figure 2B:
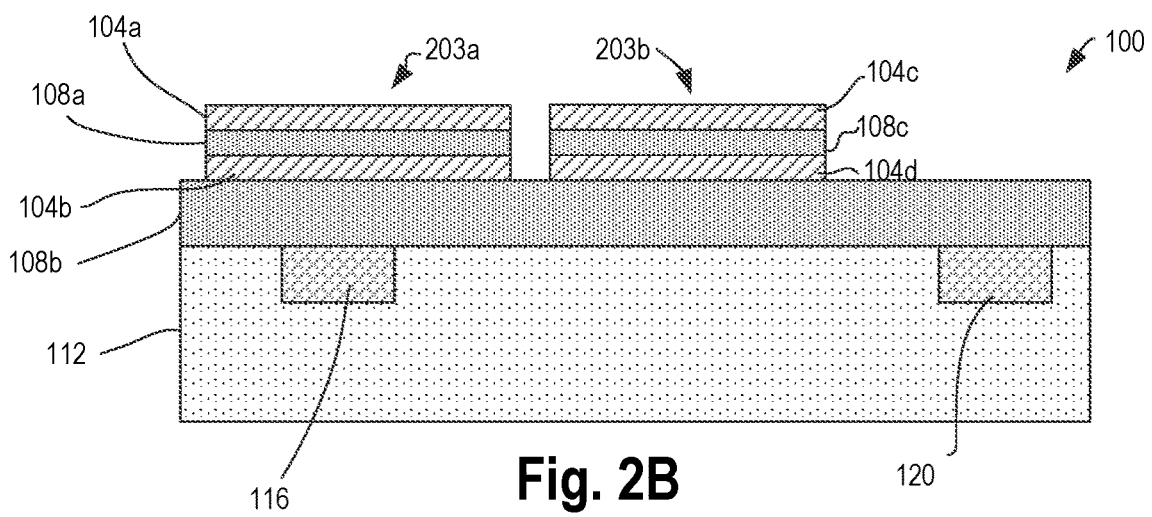
Figure 2C:
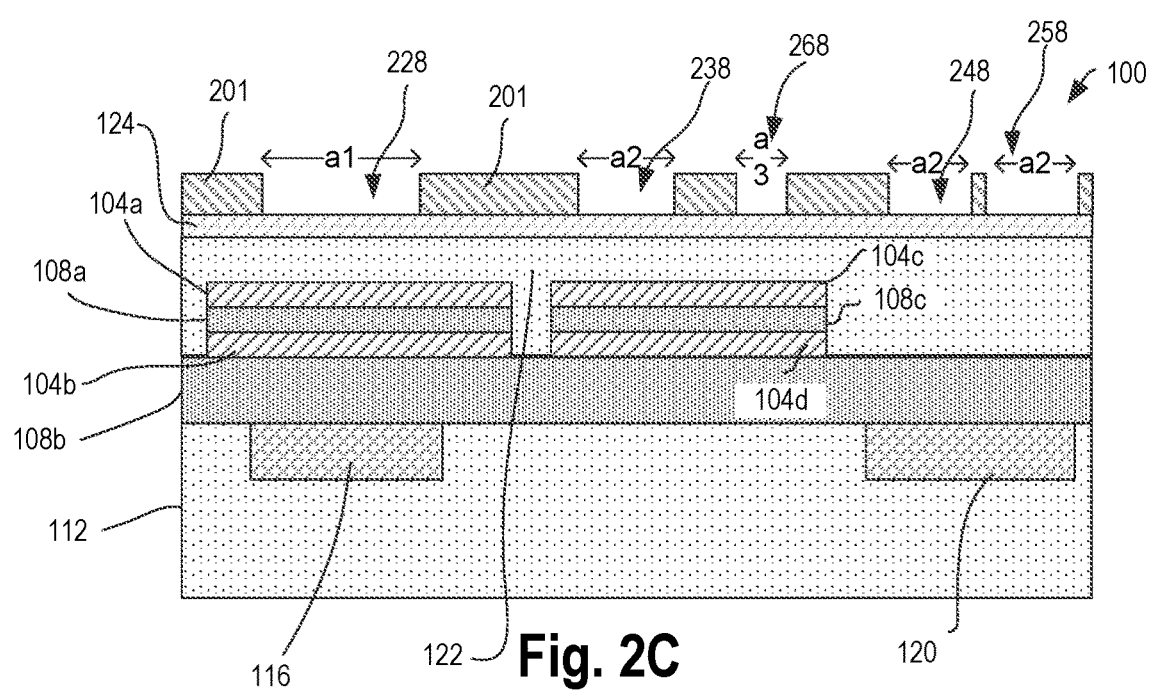
Figure 2D:
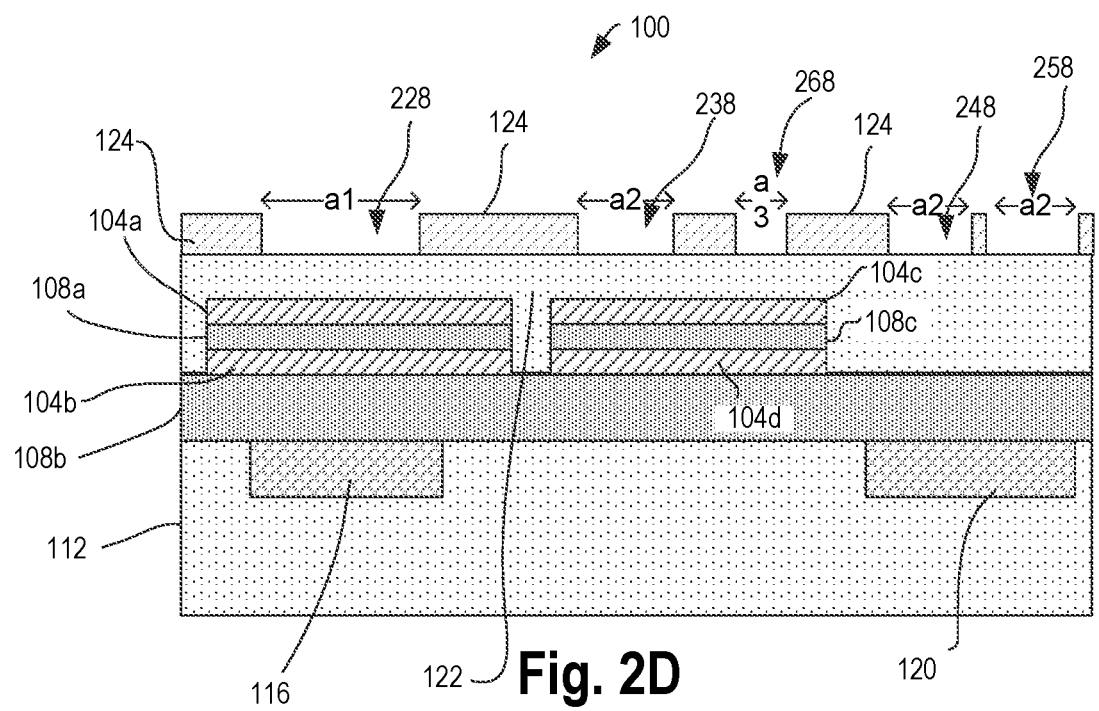
Figure 2E:
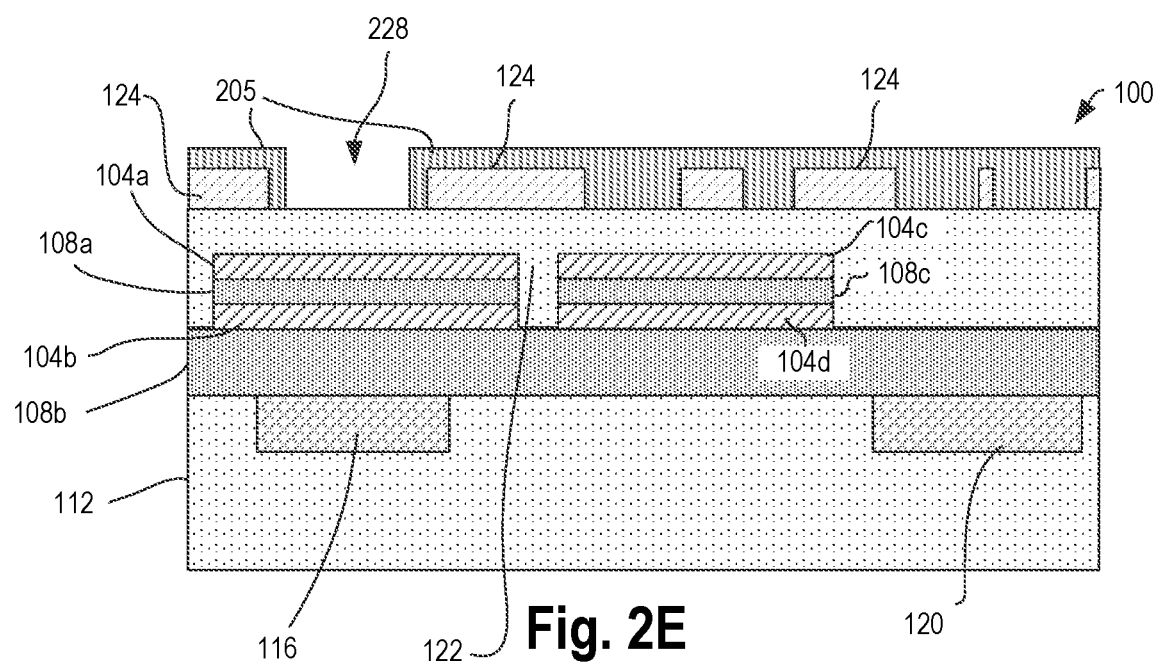
Figure 2F:
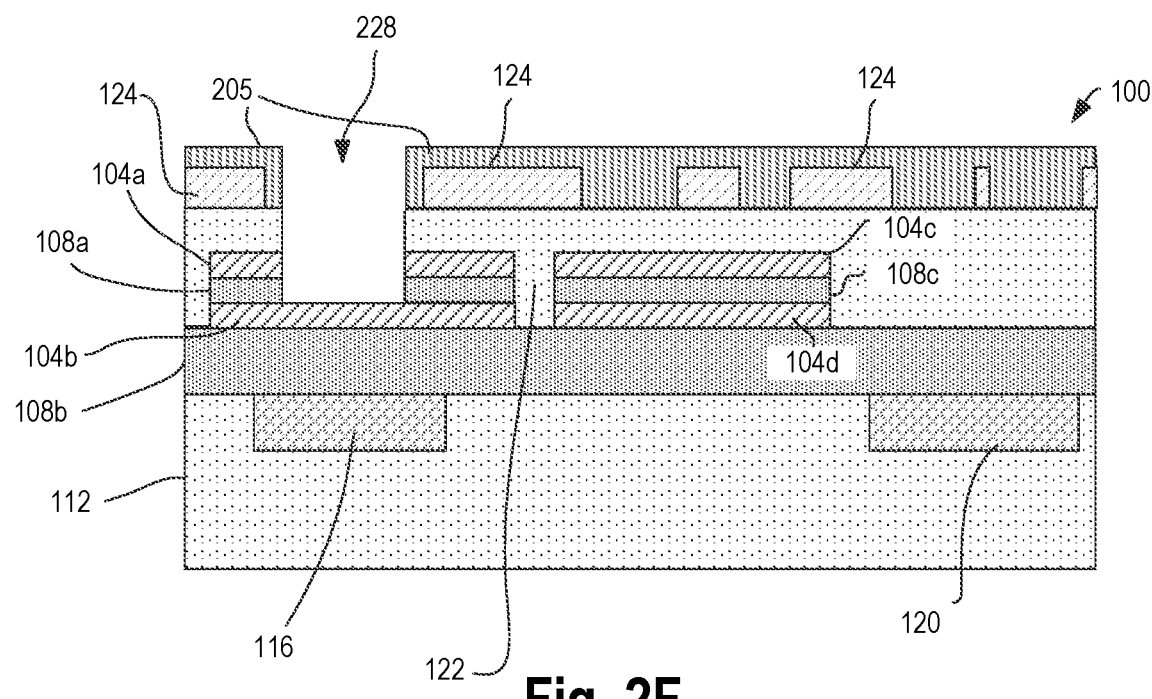
Figure 2G:
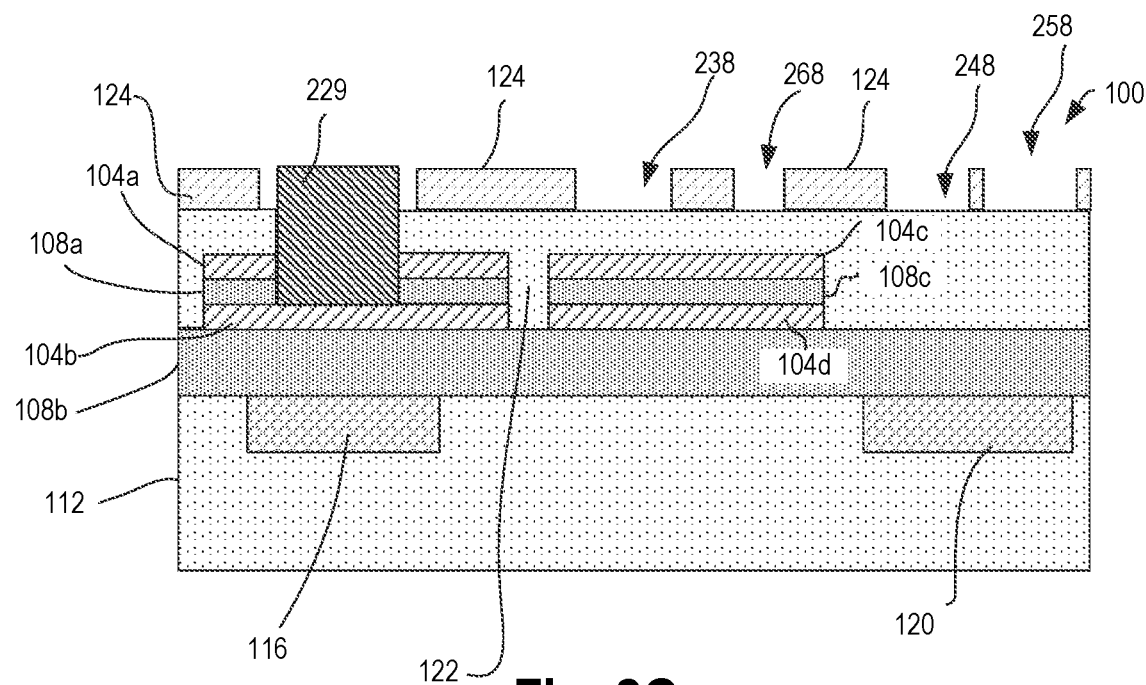
Figure 2H:
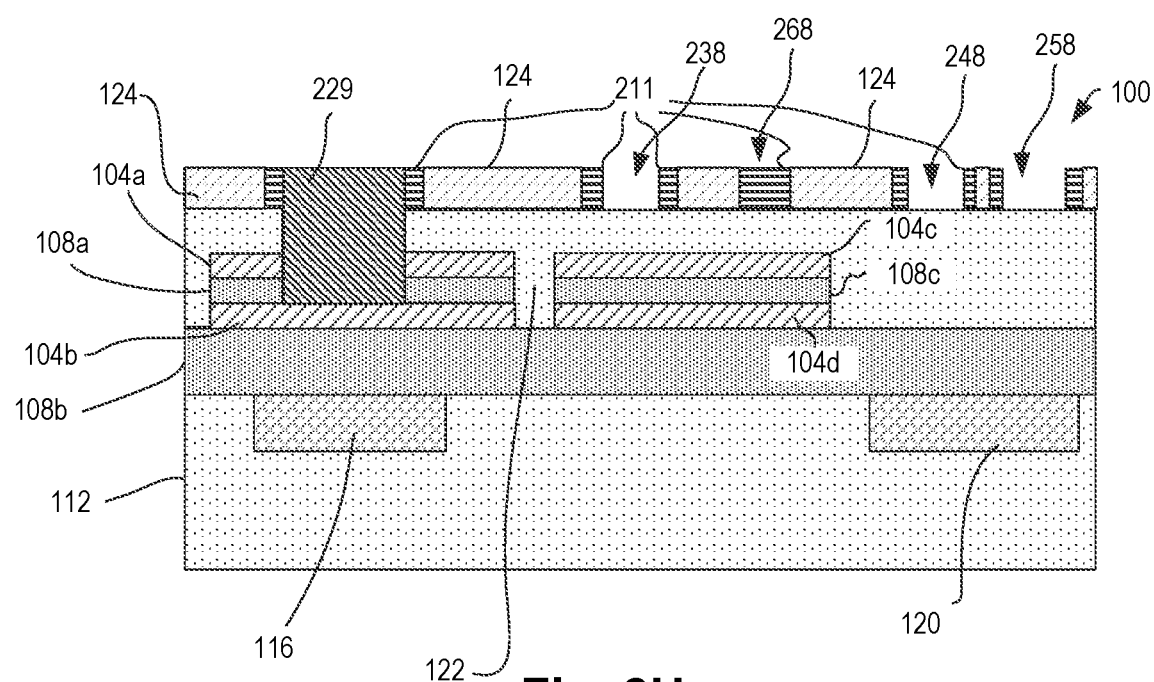
Figure 2I:
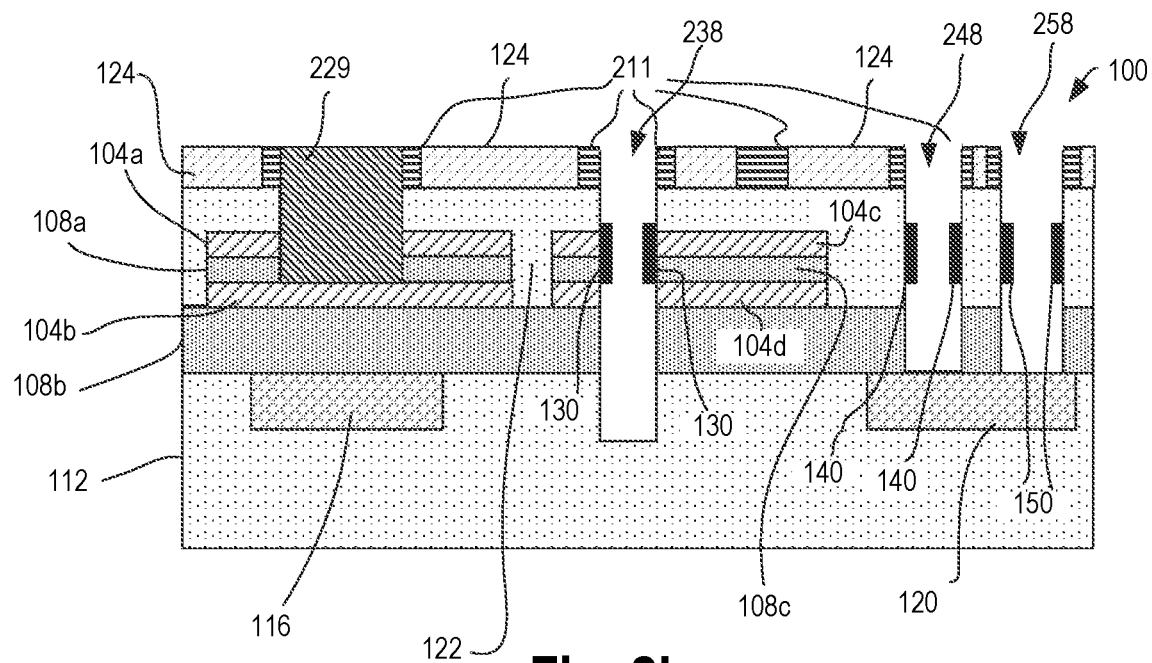
Figure 2J:
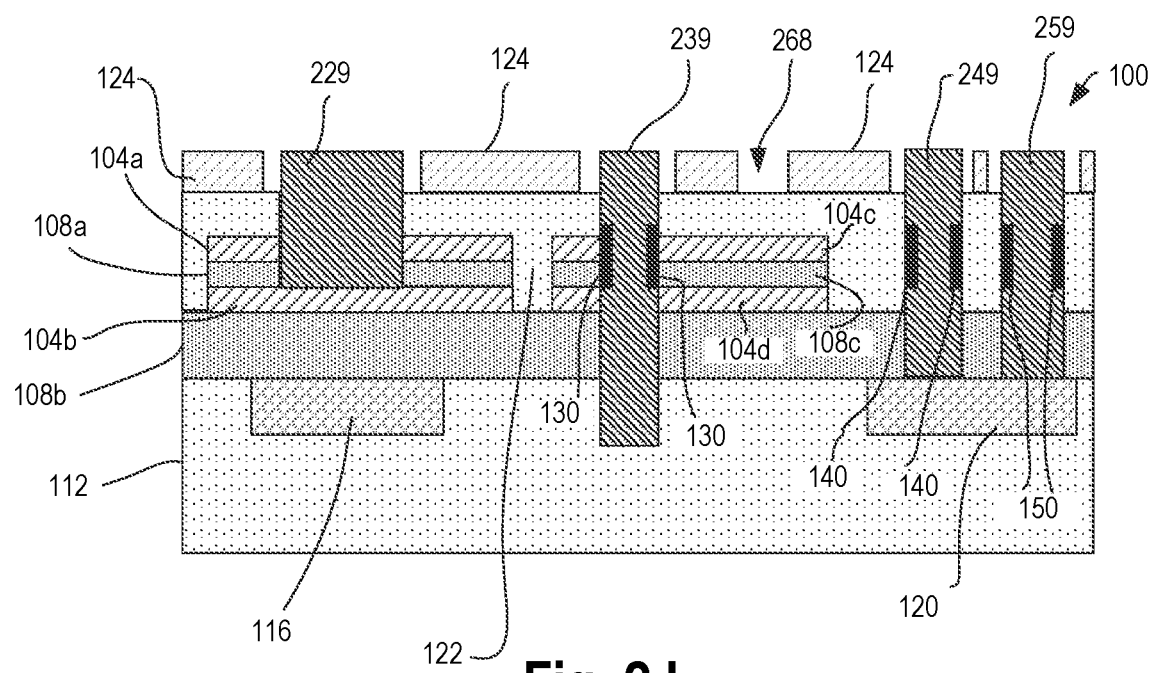
Figure 2K:
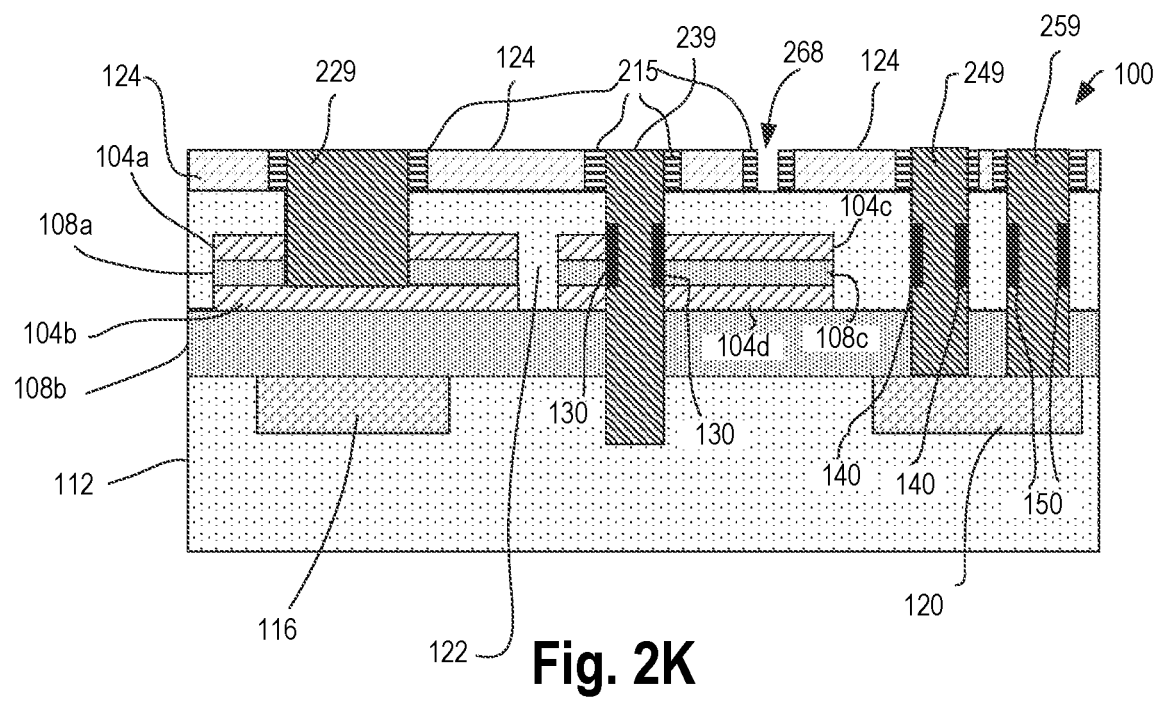
Figure 2L:
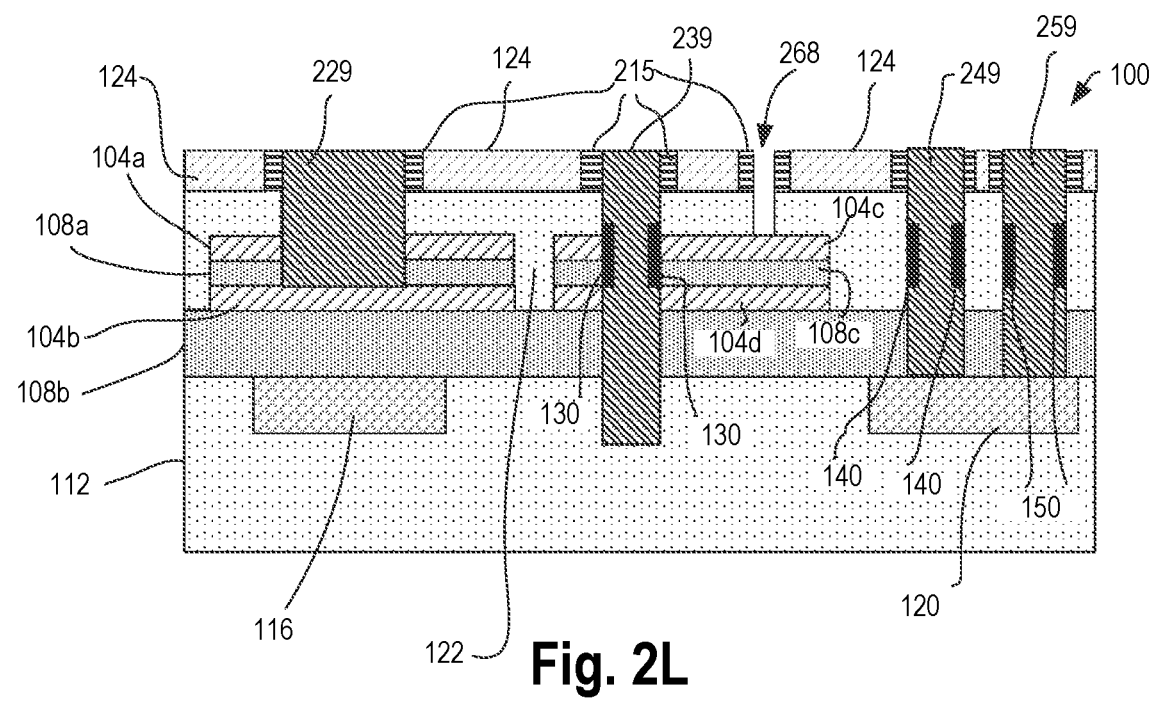
Figure 2M:
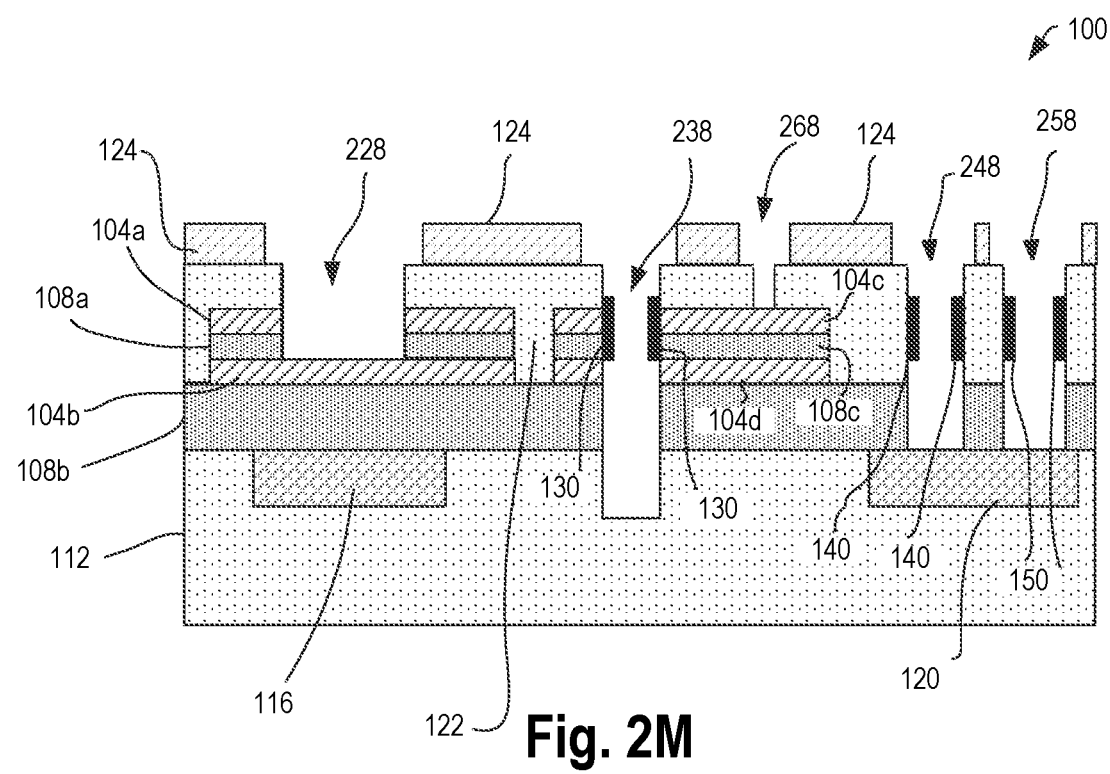
Figure 2N:
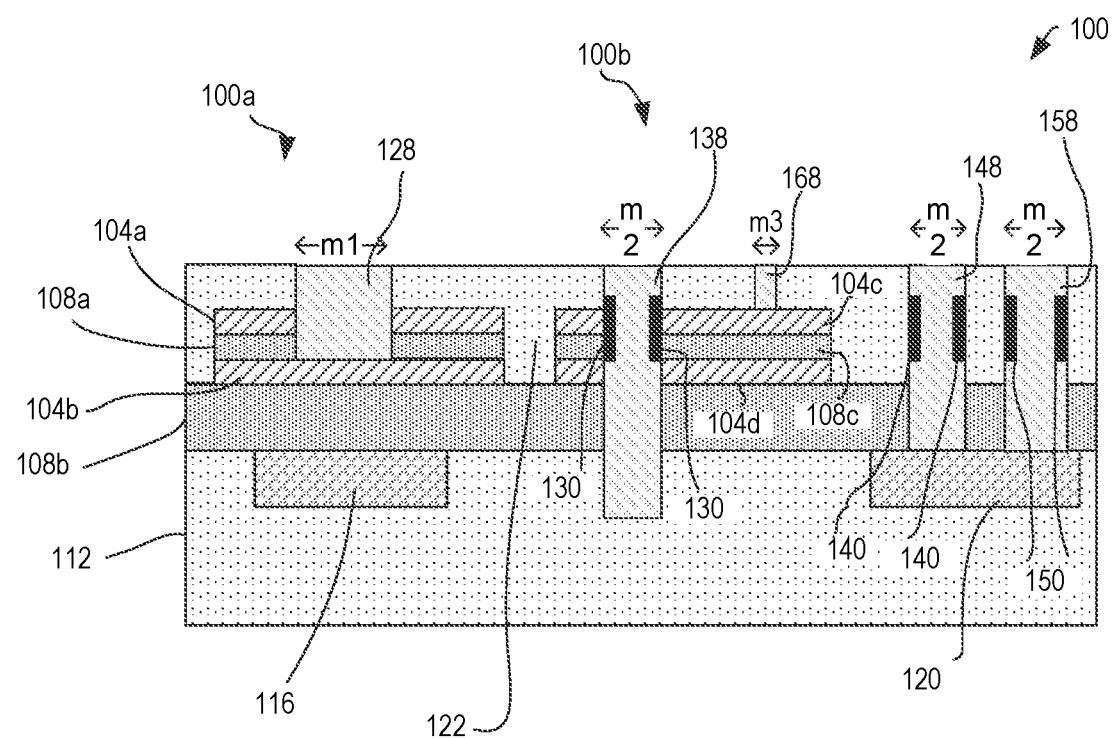

FIG. 2A-2N illustrate example processes for formation of the device 100 of FIG. 1A, according to some embodiments. For example, FIGS. 2A-2N are cross-sectional views of the device 100 evolving as example operations for formation of the device 100 are performed.

Referring to FIG. 2A, multiple interleaved and stacked conductive layers 204a, 204b, and insulating layers 208a, 108b may be formed over the ILD 112. The stack of the conductive layers 204a, 204b, and the insulating layers 208a, 108b may be formed by deposition of thin films of conductive and insulating material. In some embodiments, the conductive layer 116 and the interconnect layer 120 are formed at appropriate positions underneath the insulating layer 108b.

Referring now to FIG. 2B, the stack of the conductive layers 204a, 204b, and insulating layers 208a, 108b may be etched to form a first stack 203a and a second stack 203b. The first stack 203a may comprise conductive layer 104a, insulating layer 108a, conductive layer 104b, and insulating layer 108b; and the second stack 203b may comprise conductive layer 104c, insulating layer 108c, conductive layer 104d, and insulating layer 108b. For example, the conductive layer 204a of FIG. 2A may be etched to form the conductive layers 104a and 104c of FIG. 2B; the insulating layer 208a of FIG. 2A may be etched to form the insulating layers 108a and 108c of FIG. 2B; and the conductive layer 204b of FIG. 2A may be etched to form the conductive layers 104b and 104d of FIG. 2B. The two stacks 203a and 203b may be adjacent to, but separate from each other, as illustrated in FIG. 2B.

The two stacks 203a, 203b of FIG. 2B may be formed by, for example, lithography using patterning and etching. The stack of FIG. 2A may be etched, e.g., using a mask, to form the stacks 203a and 203b. In some embodiments, because the stack 203a may be formed using a single mask, the layers 104a, 108a, 104b are of similar dimensions (e.g., similar length and width) and are aligned (e.g., not offset with respect to each other), as discussed with respect to FIG. 1A. In some embodiments, because the stack 203b may be formed using a single mask, the layers 104c, 108c, 104d are of similar dimensions (e.g., similar length and width) and are aligned (e.g., not offset with respect to each other), as discussed with respect to FIG. 1A.

Thus, the layers 104a and 104c are formed from a same layer 204a. In an example, the layers 104a and 104c are referred to as an upper layer of two separate capacitor stacks associated with the two MIMs 100a and 100b. Similarly, for example, the conductive layers 104b and 104d may be referred to herein as a middle layer of the MIMs 100a and 100b, respectively. Similarly, for example, the insulating layers 108a and 108c may be referred to herein as a first insulating layer of the MIMs 100a and 100b, respectively; and the insulating layer 108b may be referred to herein as a second insulating layer of the MIMs 100a and 100b, respectively.

Although the insulating layer 108b is illustrated to be a continuous layer among the two capacitor stacks of the two MIMs 100a and 100b, in some embodiments (and although not illustrated in the figures), the insulating layer 108b may also be etched to form two separate discontinuous layers for the two respective capacitor stacks.

Referring now to FIG. 2C, a ILD layer 122 may be deposited to encapsulate the stacks 203a and 203b. Subsequently, a hard mask layer 124 may be deposited on the ILD layer 122. Photoresist layer 201 comprising photoresist material may be patterned over the hard mask layer 124. In some embodiments, a first opening 228 (e.g., which may be over an eventual position of the via 128) in the photoresist layer 201 over the stack 203a has a diameter of a1. A second opening 238 and a third opening 268 (e.g., which may be over eventual positions of the vias 138 and 168, respectively) in the photoresist layer 201 over the stack 203a may have diameters of a2 and a3, respectively. A fourth opening 248 and a fifth opening 258 (e.g., which may be in eventual positions of the vias 148 and 158, respectively) in the photoresist layer 201 over the interconnect layer 120 may have diameters of about a2. In some embodiments, a1 is larger than a2, and a2 is larger than a3. For example, a1 may be at least double or more than a2, and a2 may be at least double or more of a3. The difference in the dimensions a1, a2, and a3 may facilitate the formation of the various vias, e.g., as discussed herein in further detail.

Referring now to FIG. 2D, hark mask layer 124 exposed through the photoresist layer 201 may be etched, and the photoresist layer 201 may then be removed, thereby transferring the pattern into the hark mask layer 124. Thus, the hard mask layer 124 may have various openings, e.g., similar to the openings of the photoresist layer 201 discussed herein above.

Referring now to FIG. 2E, a conformal hard mask layer 205 may be deposited (e.g., conformally deposited) on the hard mask layer 124, e.g., using thin-film deposition methods, such as plating, chemical vapor deposition, atomic layer deposition, and/or the like. The conformal hard mask layer 205 may then be etched, for example, anisotropically. In some embodiments, as the width a1 of the opening 228 is larger than the widths a2 and a3 of the other openings 238, 248, 258, 268, the conformal hard mask layer 205 forms a ridge, recess or low depth region within the opening 228. Etching of the conformal hard mask layer 205 may expose the ILD 112 through the opening 228, as illustrated in FIG. 2E. Because of the relatively low width of the other openings 238, 248, 258, 268 of the hard mask 124 (e.g., openings having width of a2 and a3), the deposition and etching of the conformal hard mask layer 205 may not expose the ILD 112 through these openings. Thus, due to the difference in the sizes of the various openings (e.g., as indicated in FIGS. 2C and 2D), the ILD 122 may be exposed only through the opening 228 (and not exposed through the other openings).

Referring now to FIG. 2F, the ILD 122, the conductive layer 104a and the insulating layer 108a may be selectively etched through the opening 228. The etching in FIG. 2F may be performed using any appropriate etching technique, e.g., dry etch, wet chemical etch, etc. The etchants used may be selective to the material of the conductive layers 104 and the insulating layer 108. Merely as an example, initially a selective etchant may be used to etch the ILD 122 underneath the opening 228. Subsequently, another selective etchant may be used to etch the conductive layer 104a underneath the opening 228. Finally, yet another selective etchant may be used to etch the insulating layer 108a underneath the opening 228.

Referring now to FIG. 2G, a sacrificial material 229 may be deposited in the opening 228. Subsequently, the conformal hard mask layer 205 may be removed (e.g., may be isotropically etched or stripped), thereby recovering the openings 238, 248, 258, 268, as illustrated in FIG. 2G.

Referring now to FIG. 2H, a conformal hard mask layer 211 may be deposited (e.g., conformally deposited) on the hard mask layer 124, e.g., using thin-film deposition methods, such as plating, chemical vapor deposition, atomic layer deposition, and/or the like. The conformal hard mask layer 211 may then be etched. In some embodiments, as the width a2 of the openings 238, 248, 258 is larger than the width a3 of the opening 268, the conformal hard mask layer 211 forms a ridge, recess or low depth region within the opening 238, 248, 258. Etching of the conformal hard mask layer 211 may expose the ILD 112 through the openings 238, 248, 258, as illustrated in FIG. 2H. Because of the relatively low width of the opening 268 of the hard mask 124 (e.g., opening having width of a3), the deposition and etching of the conformal hard mask layer 211 may not expose the ILD 112 through this opening, as illustrated in FIG. 2H. Thus, due to the difference in the sizes of the various openings (e.g., as indicated in FIGS. 2C and 2D), the ILD 122 may be exposed only through the openings 238, 248, 258 of the hard mask layer 124 (and not exposed through the opening 268).

Referring now to FIG. 2I, the ILD 122, the conductive layers 104c, 104d, the insulating layers 108c, 108b (and optionally at least a part of IDL 122) may be selectively etched through the opening 238. In some embodiments, the ILD 122 also is selectively etched through the openings 248 and 258. The etching in FIG. 2I may be performed using any appropriate etching technique, e.g., dry etch, wet chemical etch, etc., using one or more selective etchants (e.g., as discussed with respect to FIG. 2F). In some embodiments, spacers 130 are deposited within sections of the sidewalls of the opening 238, e.g., such that the spacers 130 may block the conductive layer 130 (and may also optionally at least partially or fully block through the insulating layer 108c) from the opening 238.

Merely as an example (and although not illustrated in the figures), the opening 238 may be initially extended through the ILD 122 and the layers 104c and 108c (but not though the layers 104d, 108b). Subsequently, the spacers 130 may be formed through the opening 238 on the sidewalls of the ILD 122 and the layers 104c, 108c, 104d. Sections of the spacers 130 may then be selectively etched from the sidewalls of the ILD 122 and the hard mask layer 211, but other sections of the spacers 130 may remain on the sidewalls of the layers 108c, 104c. Then the opening 238 may be extended through the layers 104d, 108b, and possibly through the ILD 112, as illustrated in FIG. 2I. Examples of deposition of spacers on selective sections of sidewalls of an opening are discussed in further detail in co-pending U.S. patent application Ser. No. 16/651,296. In some embodiments, spacers 140 and 150 are deposited within sections of the sidewalls of the openings 248 and 258, respectively.

Referring now to FIG. 2J, sacrificial material 239, 249, and 259 may be respectively deposited in the openings 238 248, and 258, and the conformal hard mask layer 211 may be removed (e.g., may be etched), thereby recovering the opening 268.

Referring now to FIG. 2K, a conformal hard mask layer 215 may be deposited on the hard mask layer 124, e.g., using thin-film deposition methods, such as plating, chemical vapor deposition, atomic layer deposition, and/or the like. The conformal hard mask layer 215 may then be etched. In some embodiments, the conformal hard mask layer 215 are deposited in the opening 268, as well as the small openings adjacent to the sacrificial materials 229, 239, 249, and 259. However, the width a3 of the opening 268 may be larger than the width of the openings adjacent to the sacrificial materials 229, 239, 249, and 259. Thus, the conformal hard mask layer 215 may form a ridge, recess or low depth region within the opening 268. Etching of the conformal hard mask layer 215 may expose the ILD 112 through the opening 268, as illustrated in FIG. 2K.

Referring now to FIG. 2L, the ILD 122 may be selectively etched through the opening 268. The etching in FIG. 2L may be performed using any appropriate etching technique, e.g., dry etch, wet chemical etch, etc., using one or more selective etchants (e.g., as discussed with respect to FIG. 2F). In some embodiments, the opening 268 is now in contact with (and possibly partially or fully extending through, although not illustrated in the figures) the conductive layer 104c.

Referring now to FIG. 2M, the sacrificial materials 229, 239, 249, and 259 may be removed by an appropriate selective etching process. In some embodiments, the conformal hard mask layer 215 is also removed, as illustrated in FIG. 2M.

Referring now to FIG. 2N, the openings 228, 238, 248, 258, and 268 are respectively filled with conductive material (e.g., metal) to form vias 128, 138, 148, 158, and 168. The device 100 in FIG. 2N is similar to the device 100 of FIG. 1A.

Thus, referring now to FIGS. 1A-2N, in some embodiments, the device 100 comprises a high voltage capacitor formed using the MIM 100a, and an adjacent low voltage capacitor formed using the MIM 100b. For example, a capacitor may be formed between the conductive layer 104b and the electrode 116 of the MIM 100a. As the insulating layer 108b may be relatively thick (e.g., having height higher than the height of the insulating layer 108c), the capacitor developed between the via 128 and the electrode 116 of the MIM 100a may be able to handle relatively higher voltage (e.g., compared to that of the MIM 100b). Similarly, a capacitor may be formed between the conductive layers 104c and 104d. As the insulating layer 108c may be relatively thin (e.g., having height lower than the height of the insulating layer 108b, as a result of which the insulating layers 108b may have a higher breakdown voltage than one or both of the insulating layers 108a and 108c), the capacitor developed between the conductive layers 104c and 104d of the MIM 100b may be able to handle relatively lower voltage (e.g., compared to that of the MIM 100a). In some embodiments, a capacitance per unit area of the capacitor of the MIM 100a is lower than a capacitance per unit area of second capacitor of the MIM 100b.

Figure 3:
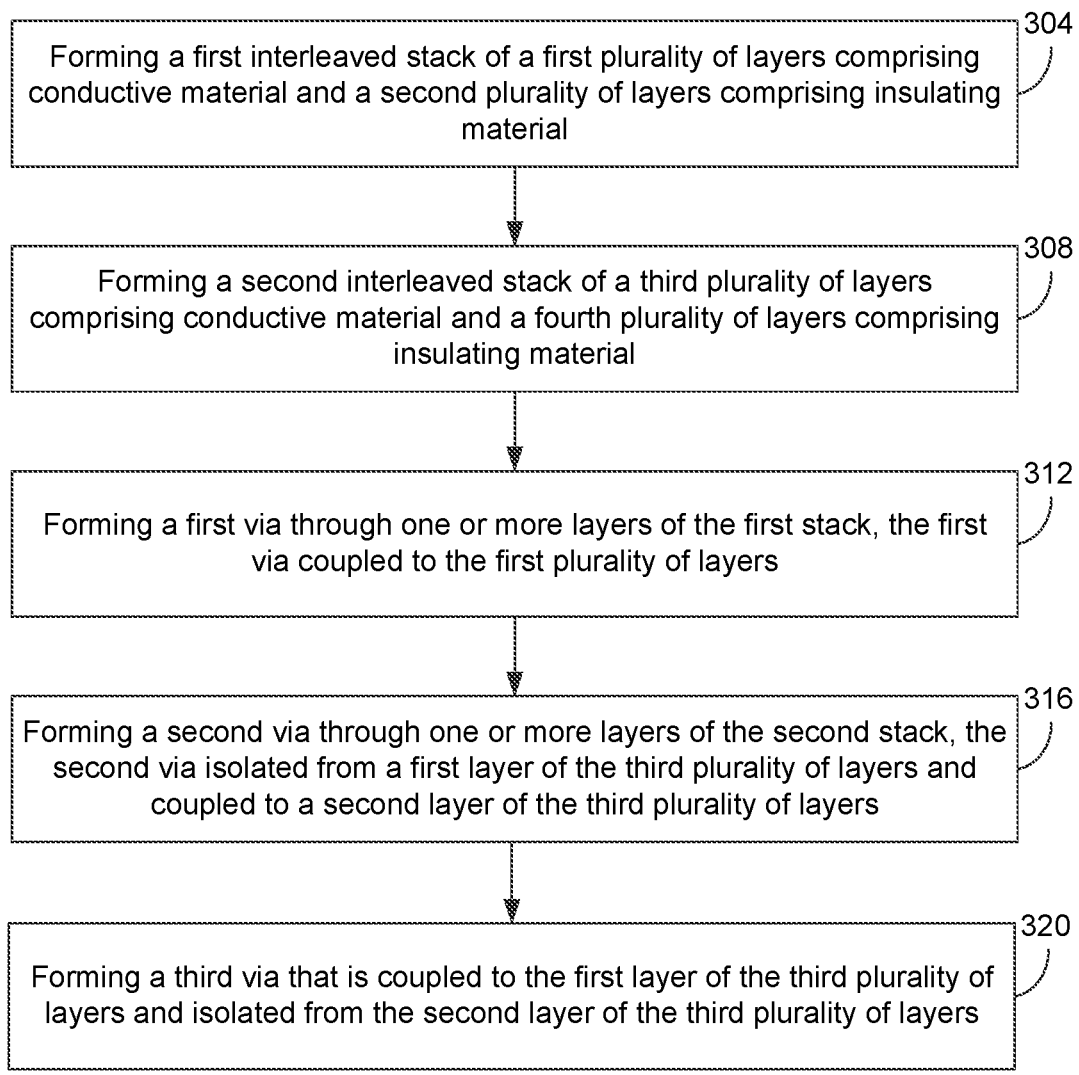
FIG. 3 is flow diagrams illustrating a method of forming the device of FIG. 1A comprising the MIM with the high voltage capacitor and the MIM with the low voltage capacitor, according to some embodiments.

FIG. 3 is flow diagrams illustrating a method 300 of forming the device 100 of FIG. 1A comprising the MIM 100a with the high voltage capacitor and the MIM 100b with the low voltage capacitor, according to some embodiments. Although the blocks in the flowchart with reference to FIG. 3 are shown in a particular order, the order of the actions can be modified. Thus, the illustrated embodiments can be performed in a different order, and some actions/blocks may be performed in parallel. Some of the blocks and/or operations listed in FIG. 3 may be optional in accordance with certain embodiments. The numbering of the blocks presented is for the sake of clarity and is not intended to prescribe an order of operations in which the various blocks must occur.

In some embodiments, the method 300 comprises, at 304, forming a first interleaved stack of a first plurality of layers (e.g., conductive layers 104a and 104b) comprising conductive material and a second plurality of layers (e.g., insulating layer 108a and 108b) comprising insulating material. The method further comprises, at 308, forming a second interleaved stack of a third plurality of layers (e.g., conductive layers 104c and 104d) comprising conductive material and a fourth plurality of layers comprising insulating material (e.g., insulating layer 108c and 108b).

The method further comprises, at 312, forming a first via (e.g., via 128) through one or more layers of the first stack, the first via coupled to two of the first plurality of layers. The method further comprises, at 316, forming a second via (e.g., via 138) through one or more layers of the second stack, the second via isolated from a first layer (e.g., conductive layer 104c) of the third plurality of layers and coupled to a second layer (e.g., conductive layer 104d) of the third plurality of layers. The method further comprises, at 320, forming a third via (e.g., via 168) that is coupled to the first layer of the third plurality of layers and isolated from the second layer of the third plurality of layers.

In some embodiments, forming the first via comprises: forming an ILD (e.g., ILD 122) over the first interleaved stack and the second interleaved stack; forming a hard mask layer (e.g., hard mask layer 201) over the ILD, the hard mask layer comprising: a first opening (e.g., opening 228) for formation of the first via, a second opening (e.g., opening 238) for formation of the second via, and a third opening (e.g., opening 268) for formation of the third via; depositing a conformal hard mask layer (e.g., conformal hard mask layer 205) over the hard mask layer; etching the conformal hard mask layer such that: the conformal hard mask layer does not fully cover the first opening, and the ILD is exposed through the first opening, and the conformal hard mask layer substantially covers the second and third openings, and the ILD is not exposed through the second and third openings (e.g., as illustrated in FIG. 2E); and selectively etching the ILD and the first interleaved stack to extend the first opening, without affecting the second or third openings (e.g., as illustrated in FIG. 2F), wherein the first via is formed in the extended first opening.

FIG. 4 illustrates a computing device or a SoC (System-on-Chip) 2100 comprising a device (e.g., device 100 of FIG. 1A) including a MIM (e.g., the MIM 100a) with a high voltage capacitor and a MIM (e.g., the MIM 100b) with a low voltage capacitor, according to some embodiments. It is pointed out that those elements of FIG. 4 having the same reference numbers (or names) as the elements of any other figure can operate or function in any manner similar to that described, but are not limited to such.

In some embodiments, computing device 2100 represents an appropriate computing device, such as a computing tablet, a mobile phone or smart-phone, a laptop, a desktop, an IOT device, a server, a set-top box, a wireless-enabled e-reader, or the like. It will be understood that certain components are shown generally, and not all components of such a device are shown in computing device 2100.

In some embodiments, computing device 2100 includes a first processor 2110. The various embodiments of the present disclosure may also comprise a network interface within 2170 such as a wireless interface so that a system embodiment may be incorporated into a wireless device, for example, cell phone or personal digital assistant.

In one embodiment, processor 2110 can include one or more physical devices, such as microprocessors, application processors, microcontrollers, programmable logic devices, or other processing means. The processing operations performed by processor 2110 include the execution of an operating platform or operating system on which applications and/or device functions are executed. The processing operations include operations related to I/O with a human user or with other devices, operations related to power management, and/or operations related to connecting the computing device 2100 to another device. The processing operations may also include operations related to audio I/O and/or display I/O.

In one embodiment, computing device 2100 includes audio subsystem 2120, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 2100, or connected to the computing device 2100. In one embodiment, a user interacts with the computing device 2100 by providing audio commands that are received and processed by processor 2110.

Display subsystem 2130 represents hardware (e.g., display devices) and software (e.g., drivers) components that provide a visual and/or tactile display for a user to interact with the computing device 2100. Display subsystem 2130 includes display interface 2132, which includes the particular screen or hardware device used to provide a display to a user. In one embodiment, display interface 2132 includes logic separate from processor 2110 to perform at least some processing related to the display. In one embodiment, display subsystem 2130 includes a touch screen (or touch pad) device that provides both output and input to a user.

I/O controller 2140 represents hardware devices and software components related to interaction with a user. I/O controller 2140 is operable to manage hardware that is part of audio subsystem 2120 and/or display subsystem 2130. Additionally, I/O controller 2140 illustrates a connection point for additional devices that connect to computing device 2100 through which a user might interact with the system. For example, devices that can be attached to the computing device 2100 might include microphone devices, speaker or stereo systems, video systems or other display devices, keyboard or keypad devices, or other I/O devices for use with specific applications such as card readers or other devices.

As mentioned above, I/O controller 2140 can interact with audio subsystem 2120 and/or display subsystem 2130. For example, input through a microphone or other audio device can provide input or commands for one or more applications or functions of the computing device 2100. Additionally, audio output can be provided instead of, or in addition to display output. In another example, if display subsystem 2130 includes a touch screen, the display device also acts as an input device, which can be at least partially managed by I/O controller 2140. There can also be additional buttons or switches on the computing device 2100 to provide I/O functions managed by I/O controller 2140.

In one embodiment, I/O controller 2140 manages devices such as accelerometers, cameras, light sensors or other environmental sensors, or other hardware that can be included in the computing device 2100. The input can be part of direct user interaction, as well as providing environmental input to the system to influence its operations (such as filtering for noise, adjusting displays for brightness detection, applying a flash for a camera, or other features).

In one embodiment, computing device 2100 includes power management 2150 that manages battery power usage, charging of the battery, and features related to power saving operation. Memory subsystem 2160 includes memory devices for storing information in computing device 2100. Memory can include nonvolatile (state does not change if power to the memory device is interrupted) and/or volatile (state is indeterminate if power to the memory device is interrupted) memory devices. Memory subsystem 2160 can store application data, user data, music, photos, documents, or other data, as well as system data (whether long-term or temporary) related to the execution of the applications and functions of the computing device 2100. In one embodiment, computing device 2100 includes a clock generation subsystem 2152 to generate a clock signal.

Elements of embodiments are also provided as a machine-readable medium (e.g., memory 2160) for storing the computer-executable instructions (e.g., instructions to implement any other processes discussed herein). The machine-readable medium (e.g., memory 2160) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 2170 includes hardware devices (e.g., wireless and/or wired connectors and communication hardware) and software components (e.g., drivers, protocol stacks) to enable the computing device 2100 to communicate with external devices. The computing device 2100 could be separate devices, such as other computing devices, wireless access points or base stations, as well as peripherals such as headsets, printers, or other devices.

Connectivity 2170 can include multiple different types of connectivity. To generalize, the computing device 2100 is illustrated with cellular connectivity 2172 and wireless connectivity 2174. Cellular connectivity 2172 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 2174 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 2180 include hardware interfaces and connectors, as well as software components (e.g., drivers, protocol stacks) to make peripheral connections. It will be understood that the computing device 2100 could both be a peripheral device ("to" 2182) to other computing devices, as well as have peripheral devices ("from" 2184) connected to it. The computing device 2100 commonly has a "docking" connector to connect to other computing devices for purposes such as managing (e.g., downloading and/or uploading, changing, synchronizing) content on computing device 2100. Additionally, a docking connector can allow computing device 2100 to connect to certain peripherals that allow the computing device 2100 to control content output, for example, to audiovisual or other systems.

In addition to a proprietary docking connector or other proprietary connection hardware, the computing device 2100 can make peripheral connections 2180 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

In some embodiments, the device 100 (e.g., comprising the MIM 100a and/or the MIM 100b, as discussed with respect to FIG. 1A) may be used as a high voltage capacitor and a low voltage capacitor in any appropriate component of the computing device 2100. The device 100 may be formed, e.g., as discussed with respect to FIGS. 2A-3. In some embodiments, the device 100 may be used for any appropriate application of the computing device 2100, e.g., where one or more capacitors may be used (e.g., may be used in the processor 2110, in a memory of the memory subsystem 2160, or in another component).

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

Example 1. An integrated circuit (IC) structure, comprising: a first stack comprising a lower, a middle, and an upper layer of conductive material with insulator layers therebetween, wherein a first of the insulator layers has a lower breakdown voltage than a second of the insulator layers; a second stack comprising at least the middle and upper layers of conductive material with one of the insulator layers therebetween; a first via comprising conductive material and over the first stack, wherein the first via is in contact with a pair of the lower, middle and upper layers that have the first of the insulator layers therebetween; and a second via comprising conductive material and over the second stack, wherein the second via extends through the upper layer and is in contact with the middle layer, the second via isolated from a sidewall of the upper layer by a spacer comprising a dielectric material.

Example 2. The IC structure of example 1 or any other example, wherein the first of the insulator layers is between the middle and upper layers.

Example 3. The IC structure of example 2 or any other example, wherein a breakdown voltage of the spacer exceeds the breakdown voltage of the second of the insulator layers between the middle and lower layers.

Example 4. The IC structure of example 3 or any other example, wherein a thickness of the second of the insulator layers is greater than a thickness of the first of the insulator layers.

Example 5. The IC structure of example 4 or any other example, wherein the first and the second of the insulator layers both comprise oxygen and silicon, or both comprise oxygen and a metal.

Example 6. The IC structure of example 1 or any other example, wherein: a portion of the first via extending through the upper layer has a first diameter; a portion of the second via extending through the upper layer has a second diameter; and the first diameter is at least twice the second diameter.

Example 7. The IC structure of example 1 or any other example, further comprising a third via comprising conductive material, wherein the third via is in contact with the upper layer but not the middle layer.

Example 8. The IC structure of example 7 or any other example, wherein: a portion of the first via extending through the upper layer has a first diameter; a portion of the second via extending through the upper layer has a second diameter; the first diameter is at least twice the second diameter; a portion of the third via intersecting the upper layer has a third diameter; and the second diameter is at least twice the third diameter.

Example 9. The IC structure of example 1 or any other example, wherein: a section of the upper layer in the first stack is isolated from another section of the upper layer in the second stack; a section of the middle layer in the first stack is isolated from another section of the middle layer in the second stack; a section of the first of the insulator layers in the first stack is isolated from another section of the first of the insulator layers in the second stack; and the second of the insulator layers is a continuous layer in the first and second stacks.

Example 10. The IC structure of example 1 or any other example, wherein: the spacer is between the sidewall of the upper layer and a portion of the second via that extends through the upper layer.

Example 11. The IC structure of any of examples 1-10 or any other example, wherein: the first of the insulator layers has a higher capacitance per unit area than the second of the insulator layers.

Example 12. The IC structure of any of examples 1-10 or any other example, wherein: the first stack comprises a first capacitor with a first terminal comprising the first via and a second terminal comprising the lower layer; the second stack comprises a second capacitor with a first terminal comprising the upper layer of the second stack and a second terminal comprising the middle layer of the second stack; a voltage rating of the first capacitor is higher than a voltage rating of the second capacitor; and a capacitance per unit area of the first capacitor is lower than a capacitance per unit area of the second capacitor.

Example 13. The IC structure of any of examples 1-10 or any other example, further comprising: a third stack separate from the first and second stacks, the third stack comprising the second of the insulator layers and another lower layer of conductive material; and a third via and a fourth via extending through the second of the insulator layers and in contact with the another lower layer.

Example 14. A system comprising: a memory to store instructions; and a processor coupled to the memory, the processor to execute the instructions, wherein one of the memory, the processor, or another component of the system comprises: a first stack comprising a lower, a middle, and an upper layer of conductive material with insulator layers therebetween, wherein a first of the insulator layers has a lower breakdown voltage than a second of the insulator layers; a second stack comprising at least the middle and upper layers of conductive material with one of the insulator layers therebetween; a first via comprising conductive material and over the first stack, wherein the first via is in contact with a pair of the lower, middle and upper layers that have the first of the insulator layers therebetween; and a second via comprising conductive material and over the second stack, wherein the second via extends through the upper layer and is in contact with the middle layer, the second via isolated from a sidewall of the upper layer.

Example 15. The system of example 14 or any other example, further comprising: a spacer between the sidewall of the upper layer and a portion of the second via that extends through the upper layer, the spacer comprising dielectric material.

Example 16. The system of example 14 or any other example, wherein a thickness of the second of the insulator layers is greater than a thickness of the first of the insulator layers.

Example 17. A method comprising: forming a first stack of lower, middle, and upper layers comprising conductive material with insulator layers therebetween; forming a second stack of the middle and upper layers of conductive material with one of the insulator layers therebetween; forming a hard mask layer over the first stack and the second stack, the hard mask layer comprising: a first opening over the first stack, and second and third openings over the second stack; forming, through the second opening, a spacer on a sidewall of the upper layer; forming a first via in the first opening, the first via in contact with two of the lower, middle, and upper layers of the first stack; and forming a second via in the second opening, the second via extending through the upper layer and in contact with the middle layer, the second via isolated from the sidewall of the upper layer by the spacer.

Example 18. The method of example 17 or any other example, wherein forming the hard mask layer comprises: forming an interlayer-dielectric (ILD) over the first stack and the second stack; and forming the hard mask layer over the ILD.

Example 19. The method of example 18 or any other example, wherein the hard mask layer is a first hard mask layer, and wherein forming the first via in the first opening comprises: conformally depositing a second hard mask layer over the first hard mask layer; selectively etching the second hard mask layer such that the ILD is exposed through the first opening, without the ILD being exposed through the second and third openings; selectively etching, through the first opening in the second hard mask layer, the ILD and the first stack to extend the first opening, without extending the second or third openings; and depositing conductive material in the first opening to form the first via.

Example 20. The method of example 18 or any other example, wherein forming the second via in the second opening comprises: conformally depositing a second hard mask layer over the first hard mask layer; selectively etching the second hard mask layer such that the ILD is exposed through the second opening, without the ILD being exposed through the third opening; selectively etching, through the second opening in the second hard mask layer, the ILD and the second stack to extend the second opening; and depositing conductive material in the second opening to form the second via, subsequent to forming the spacer.

Example 21. The method of example 18 or any other example, further comprising: depositing sacrificial material within the first opening and the second opening; conformally depositing a second hard mask layer over the first hard mask layer, subsequent to depositing the sacrificial material within the first and second openings; selectively etching the conformal hard mask layer such that the ILD is exposed through the third opening; selectively etching, through the third opening, the ILD to expose the upper layer; removing the sacrificial material; and depositing conductive material in the first opening to form the first via, in the second opening to form the second via, and in the third opening to form a third via.

Example 22. The method of any of examples 17-21 or any other example, further comprising: forming terminals of a first capacitor, such that a first terminal of the first capacitor is coupled to the first via, and a second terminal of the first capacitor is coupled to the lower layer; and forming terminals of a second capacitor, such that a first terminal of the second capacitor is coupled to the second via, and a second terminal of the second capacitor is coupled to a third via formed in the third opening.

Example 23. An apparatus comprising: means for performing the method of any of the examples 17-22 or any other example.

Example 24. An apparatus comprising: means for forming a first stack of lower, middle, and upper layers comprising conductive material with insulator layers therebetween; means for forming a second stack of the middle and upper layers of conductive material with one of the insulator layers therebetween; means for forming a hard mask layer over the first stack and the second stack, the hard mask layer comprising: a first opening over the first stack, and second and third openings over the second stack; means for forming, through the second opening, a spacer on a sidewall of the upper layer; means for forming a first via in the first opening, the first via in contact with two of the lower, middle, and upper layers of the first stack; and means for forming a second via in the second opening, the second via extending through the upper layer and in contact with the middle layer, the second via isolated from the sidewall of the upper layer by the spacer.

Example 25. The apparatus of example 24 or any other example, wherein the means for forming the hard mask layer comprises: means for forming an interlayer-dielectric (ILD) over the first stack and the second stack; and means for forming the hard mask layer over the ILD.

Example 26. The apparatus of example 25 or any other example, wherein the hard mask layer is a first hard mask layer, and wherein the means for forming the first via in the first opening comprises: means for conformally depositing a second hard mask layer over the first hard mask layer; means for selectively etching the second hard mask layer such that the ILD is exposed through the first opening, without the ILD being exposed through the second and third openings; means for selectively etching, through the first opening in the second hard mask layer, the ILD and the first stack to extend the first opening, without extending the second or third openings; and means for depositing conductive material in the first opening to form the first via.

Example 27. The apparatus of example 25 or any other example, wherein the means for forming the second via in the second opening comprises: means for conformally depositing a second hard mask layer over the first hard mask layer; means for selectively etching the second hard mask layer such that the ILD is exposed through the second opening, without the ILD being exposed through the third opening; means for selectively etching, through the second opening in the second hard mask layer, the ILD and the second stack to extend the second opening; and means for depositing conductive material in the second opening to form the second via, subsequent to forming the spacer.

Example 28. The apparatus of example 25 or any other example, further comprising: means for depositing sacrificial material within the first opening and the second opening; means for conformally depositing a second hard mask layer over the first hard mask layer, subsequent to depositing the sacrificial material within the first and second openings; means for selectively etching the conformal hard mask layer such that the ILD is exposed through the third opening; means for selectively etching, through the third opening, the ILD to expose the upper layer; means for removing the sacrificial material; and means for depositing conductive material in the first opening to form the first via, in the second opening to form the second via, and in the third opening to form a third via.

Example 29. The apparatus of any of examples 24-28 or any other example, further comprising: means for forming terminals of a first capacitor, such that a first terminal of the first capacitor is coupled to the first via, and a second terminal of the first capacitor is coupled to the lower layer; and means for forming terminals of a second capacitor, such that a first terminal of the second capacitor is coupled to the second via, and a second terminal of the second capacitor is coupled to a third via formed in the third opening.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

I claim:

1. An integrated circuit (IC) structure, comprising:
   a first stack comprising a first layer, a second layer, and a third layer each comprising a first conductive material, a first insulator layer comprising a first thickness between the first layer and the second layer and a second insulator layer comprising a second thickness between the second layer and the third layer, wherein the third layer is above the first layer;
   a second stack laterally adjacent to the first stack, wherein the second stack comprises all but the first layer of the first stack;
   a first via comprising a second conductive material, the first via partially through the first stack and wherein the first via comprises a first lateral thickness; and
   a second via comprising the second conductive material extending through the second stack, the second via comprising a variable second lateral thickness in contact with the second layer and the first insulator layer.

2. The IC structure of claim 1, wherein the first thickness is greater than or less than the second thickness.

3. The IC structure of claim 1, wherein the first insulator layer is continuous between the first and the second stack.

4. The IC structure of claim 1, wherein the first via and the second via each have a plan view profile that is substantially circular and wherein the first and the variable second lateral thicknesses are each a respective diameter of the first via and the second via.

5. The IC structure of claim 4, wherein the IC structure further comprises a first spacer laterally adjacent to and between the second via and each of the third layer and at least a portion of the second insulator layer, wherein the first spacer comprises a first dielectric material.

6. The IC structure of claim 5, wherein the second via has a first diameter adjacent to the third layer and the second insulator and a second diameter adjacent to the second layer and adjacent to the first insulator layer, wherein the second diameter is greater than the first diameter.

7. The IC structure of claim 5, the spacer is laterally adjacent to and between the second via and an entire sidewall of the second insulator layer.

8. The IC structure of claim 1, wherein the first insulator layer is discontinuous between the first via and the second via.

9. The IC structure of claim 1, wherein the first layer, the second layer and the third layer of the first stack are each respectively separated from the first layer, the second layer and the third layer of the second stack.

10. The IC structure of claim 1, wherein the second via extends to a level below the first insulator layer.

11. The IC structure of claim 1, further comprising:
    a third stack comprising a fourth layer comprising the conductive material;
    the first insulator layer on the fourth layer;
    a plurality of vias comprising the second conductive material through the first insulator layer, wherein individual ones of the plurality of vias are in contact with the fourth layer; and wherein the individual ones of the plurality of vias have a plan view profile that is substantially circular and a diameter that varies with height of individual ones of the plurality of vias.

12. The IC structure of claim 11 further comprises a second spacer comprising a second dielectric material laterally adjacent to a portion of each of the individual ones of the plurality of vias, wherein the diameter is greatest adjacent to the first insulator layer.

13. The IC structure of claim 12 further comprises a third spacer laterally adjacent to and between the second via and both the third layer and at least a portion of the second insulator layer, wherein the second spacer and the third spacer are on a same plane, and wherein the second spacer and the third spacer each comprise a same dielectric.

14. A system comprising:
    a memory to store instructions; and
    a processor circuitry coupled to the memory, the processor circuitry to execute the instructions, wherein one of the memory, the processor circuitry, or another component of the system comprises:

a first stack comprising a first, a second, and a third layer of a first conductive material and an insulator layer between each conductive material, wherein a first insulator layer comprising a first thickness is between the first layer and the second layer and a second insulator layer comprising a second thickness is between the second and the third layer;

a second stack laterally adjacent to the first stack, wherein the second stack comprises all but the first layer of the first stack;

a first via comprising a second conductive material, the first via partially through the first stack and wherein the first via comprises a first lateral thickness; and a second via comprising the second conductive material extending through the second stack, the second via comprising a variable lateral thickness in contact with the second layer and the first insulator layer.

15. The system of claim 14, further comprising a third via on at least a portion of the second stack, wherein the third via is in contact with the third layer.

16. The system of claim 14, further comprising a display subsystem coupled with the processor circuitry.

17. A method of fabricating an integrated circuit structure, the method comprising:

forming a material layer stack comprising a first insulator layer between a pair of conductive layers above a second insulator layer;

patterning a portion of the material layer stack into a plurality of stacks and exposing at least a portion of the second insulator layer;

forming a dielectric on the plurality of stacks and on the exposed portion of the second insulator layer;

patterning a portion of a first of the plurality of stacks to form an opening and forming a first via in the first opening;

patterning a second of the plurality of stacks and the second insulator to form a second opening and forming a second via in the second opening;

patterning the dielectric and the second insulator to form a third opening and forming a third via in the third opening; and forming a spacer adjacent to each of the second via and the third via.

18. The method of claim 17, wherein the pair of conductive layers comprises a first conductive layer and a second conductive layer above the first conductive layer, and wherein forming the first via further comprises:

patterning an opening in the second conductive layer and in the first insulator layer and exposing the first conductive layer; and depositing a conductive material in the first via on a portion of the first conductive layer.

19. The method of claim 18, wherein forming the spacer adjacent to the second via further comprises forming a first spacer adjacent to a sidewall of the second conductive layer and a sidewall of the first insulator layer in the second of the plurality of stacks prior to forming the second via.

20. The method of claim 19, wherein forming the spacer adjacent to the third via further comprises forming a second spacer adjacent to a portion of a sidewall of the dielectric in the third opening, prior to forming the third via.

* * * * *